US011728289B2

(12) United States Patent
Tuncer

(10) Patent No.: US 11,728,289 B2
(45) Date of Patent: Aug. 15, 2023

(54) INTEGRATED MAGNETIC ASSEMBLY WITH CONDUCTIVE FIELD PLATES

(71) Applicant: Texas Instruments Incorporated, Dallas, TX (US)

(72) Inventor: Enis Tuncer, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 234 days.

(21) Appl. No.: 17/330,621

(22) Filed: May 26, 2021

(65) Prior Publication Data

US 2022/0384370 A1 Dec. 1, 2022

(51) Int. Cl.
*H01L 23/64* (2006.01)
*H01L 23/31* (2006.01)
*H01L 23/495* (2006.01)
*H01L 21/56* (2006.01)
*H01L 21/48* (2006.01)
*H01L 49/02* (2006.01)

(52) U.S. Cl.
CPC ........ *H01L 23/645* (2013.01); *H01L 21/4825* (2013.01); *H01L 21/565* (2013.01); *H01L 23/3107* (2013.01); *H01L 23/4952* (2013.01); *H01L 23/49503* (2013.01); *H01L 23/49575* (2013.01); *H01L 23/49589* (2013.01); *H01L 28/10* (2013.01)

(58) Field of Classification Search
CPC .............. H01L 23/645; H01L 23/3107; H01L 23/49503; H01L 23/4952; H01L 23/49575; H01L 23/49589; H01L 21/4825; H01L 21/565; H01L 24/13; H01L 24/16; H01L 24/29; H01L 24/32; H01L 24/48
See application file for complete search history.

(56) References Cited

U.S. PATENT DOCUMENTS

| 10,770,378 B1 | 9/2020 | Tuncer | |
|---|---|---|---|
| 2015/0155090 A1* | 6/2015 | Burnett | H01F 27/32 336/200 |
| 2017/0309395 A1* | 10/2017 | Shiraki | H03H 7/01 |

OTHER PUBLICATIONS

J. Ted DiBene II Ph.D., "Power on Silicon with on-die Magnetics: The start of a Revolution in Power Delivery and Power Management for SoC's and High Performance Applications", Intel Corporation, for PowerSoC Oct. 1, 2010 13th Cork, Ireland.

* cited by examiner

*Primary Examiner* — Marc Anthony Armand
(74) *Attorney, Agent, or Firm* — Ronald O. Neerings; Frank D. Cimino

(57) ABSTRACT

An electronic device includes a magnetic assembly with a multilevel lamination or metallization structure having a core layer, dielectric layers and conductive features formed in metal layers on or between the dielectric layers in respective planes of orthogonal first and second directions and stacked along an orthogonal third direction. The conductive features include first and second patterned conductive features forming first and second windings, first and second conductive capacitor plates, and first and second conductive field plates, in which the first conductive capacitor plate is between the first conductive field plate and the core layer along the third direction and the second conductive capacitor plate is between the second conductive field plate and the core layer along the third direction.

20 Claims, 23 Drawing Sheets

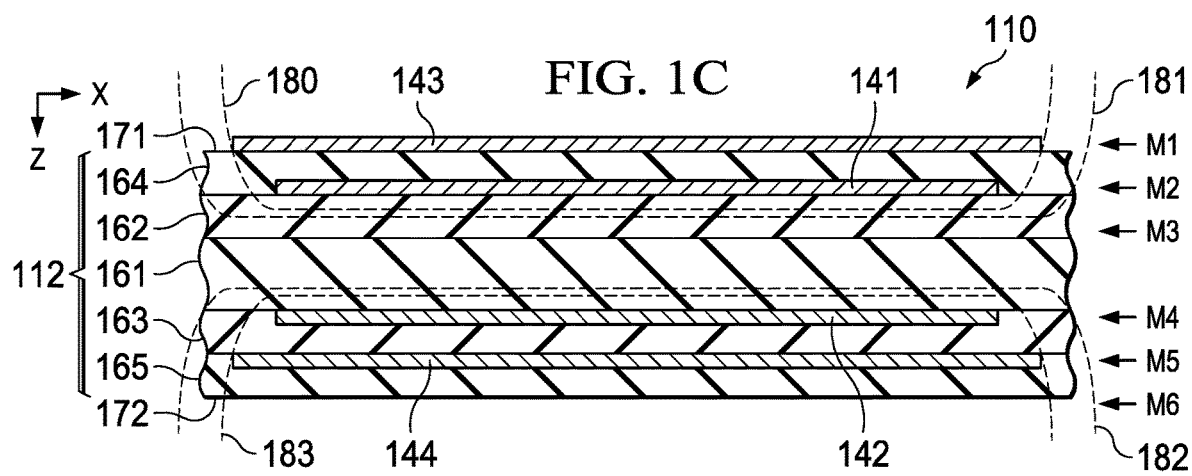
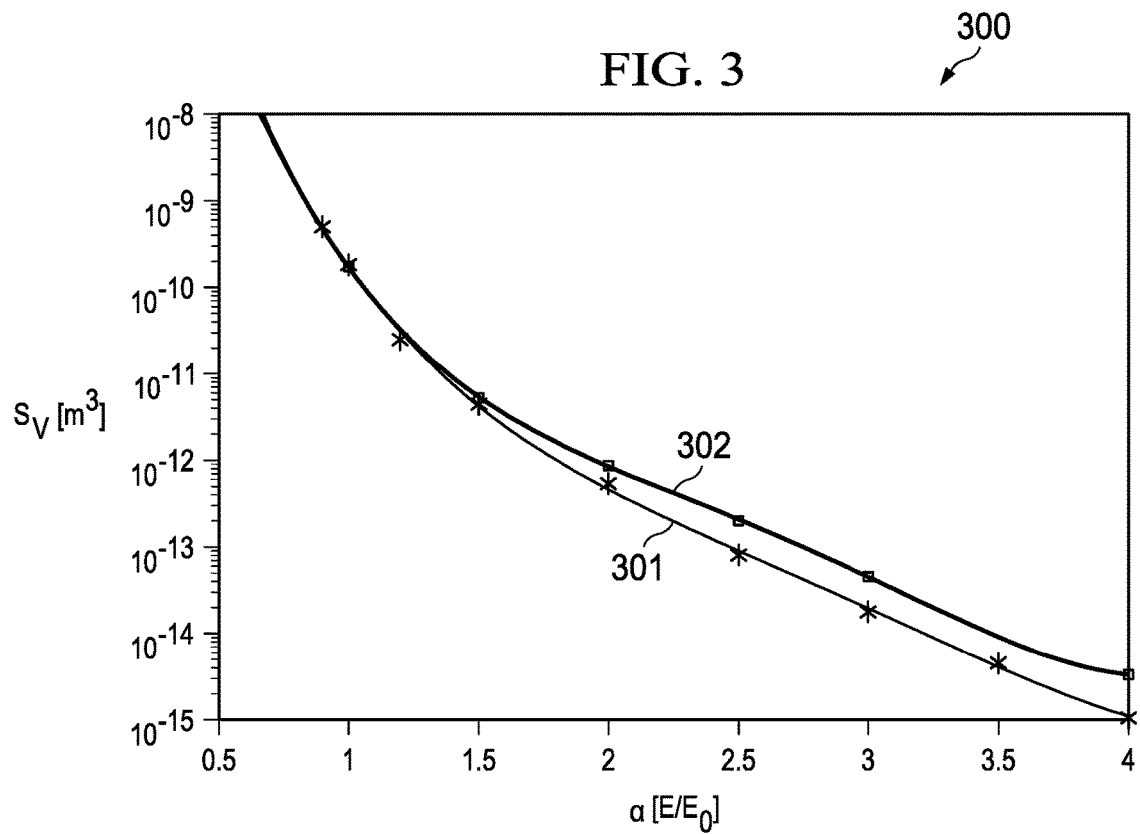

INTEGRATED MAGNETIC ASSEMBLY WITH CONDUCTIVE FIELD PLATES

BACKGROUND

High voltage isolation is sometimes used for isolated power products having transformers. Integrated isolated power products often include semiconductor dies and integrated transformers with electrical connections to externally accessible leads (e.g., pins or pads) for soldering to a printed circuit board (PCB). Transformer or inductor coils can be fabricated in a lamination structure along with one or more capacitors for integration in a packaged electronic device having isolated primary and secondary circuits. High electric fields are generated within the insulation barrier, for example, in a core layer in a multilevel lamination structure. The high electric field can generate undesired stress within the laminate isolation barrier and lead to premature failures. The thickness of the core layer or layers that provide the isolation barrier can be increased to allow low electric fields, but the size of the integrated electronic device becomes large.

SUMMARY

In one aspect, an electronic device includes a package structure and a magnetic assembly attached to a support structure in the package structure. The magnetic assembly includes a multilevel lamination or metallization structure having a core layer, dielectric layers and conductive features formed in metal layers on or between respective ones or pairs of the dielectric layers. The core layer and the dielectric layers extend in respective planes of orthogonal first and second directions. The core layer and the dielectric layers are stacked along a third direction orthogonal to the first and second directions. The conductive features include first and second patterned conductive features, first and second conductive capacitor plates and first and second conductive field plates. The first patterned conductive feature has multiple turns to form a first winding and the second patterned conductive feature has multiple turns to form a second winding. The core layer is positioned between the first and second patterned conductive features along the third direction, and the core layer is positioned between the first and second conductive capacitor plates along the third direction. The first conductive capacitor plate is positioned between the first conductive field plate and the core layer along the third direction, and the second conductive capacitor plate is positioned between the second conductive field plate and the core layer along the third direction.

In another aspect, a magnetic assembly includes a multilevel lamination or metallization structure and a magnetic core structure attached to a side of the multilevel lamination or metallization structure. The multilevel lamination or metallization structure has a core layer, dielectric layers and conductive features formed in metal layers on or between respective ones or pairs of the dielectric layers. The core layer and the dielectric layers extend in respective planes of orthogonal first and second directions and are stacked along a third direction that is orthogonal to the first and second directions. The conductive features include first and second patterned conductive features, first and second conductive capacitor plates and first and second conductive field plates. The first patterned conductive feature has multiple turns to form a first winding and the second patterned conductive feature has multiple turns to form a second winding. The core layer is positioned between the first and second patterned conductive features along the third direction, and the core layer is positioned between the first and second conductive capacitor plates along the third direction. The first conductive capacitor plate is positioned between the first conductive field plate and the core layer along the third direction, and the second conductive capacitor plate is positioned between the second conductive field plate and the core layer along the third direction.

In a further aspect, a method for fabricating an electronic device includes fabricating a magnetic assembly including first and second patterned conductive features having multiple turns to form respective first and second windings extending in respective planes of orthogonal first and second directions, as well as first and second conductive capacitor plates spaced apart from opposite sides of a core layer along a third direction and first and second conductive field plates, the first conductive capacitor plate positioned between the first conductive field plate and the core layer along the third direction, and the second conductive capacitor plate positioned between the second conductive field plate and the core layer along the third direction. The method further includes attaching the magnetic assembly to a support structure, attaching a first semiconductor die to a first die attach pad and attaching a second semiconductor die to a second die attach pad. The method also includes performing an electrical connection process that couples the first semiconductor die and the first winding in a first circuit, and couples the second semiconductor die and the second winding in a second circuit isolated from the first circuit and performing a molding process that encloses the magnetic assembly, the first and second die attach pads and the first and second semiconductor dies in a package structure.

BRIEF DESCRIPTION OF THE DRAWINGS

FIG. 1C is another partial sectional end view of the magnetic assembly taken along line 1C-1C of FIG. 1A.

FIG. 3 is a graph of stressed volume as a function of applied electric field strength for the magnetic assemblies of FIGS. 1 and 2.

DETAILED DESCRIPTION

Figure 1:
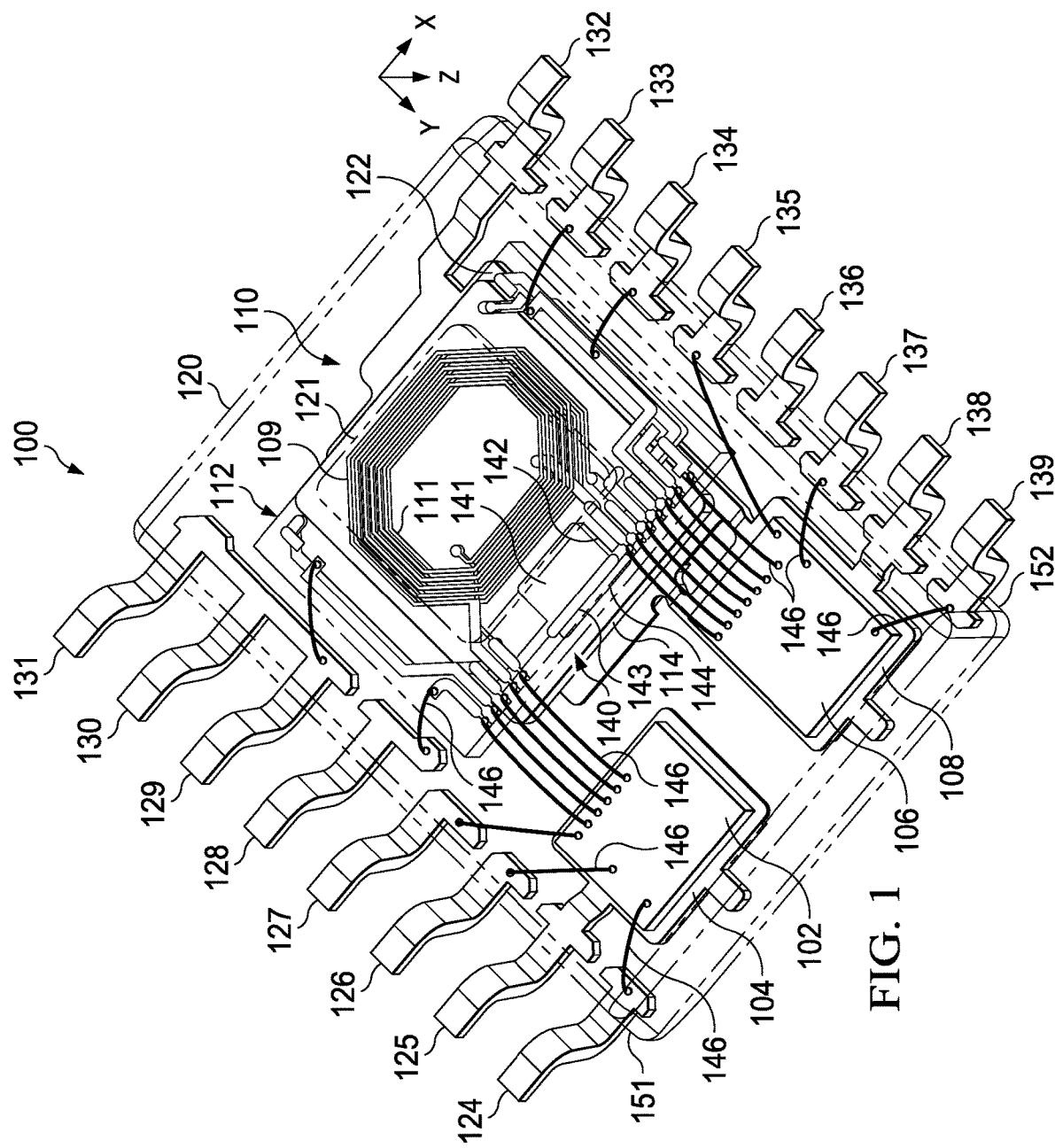
FIG. 1 is a bottom perspective view of a packaged electronic device that includes a magnetic assembly having coil windings, capacitor plates and conductive field plates.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

Figure 1A:
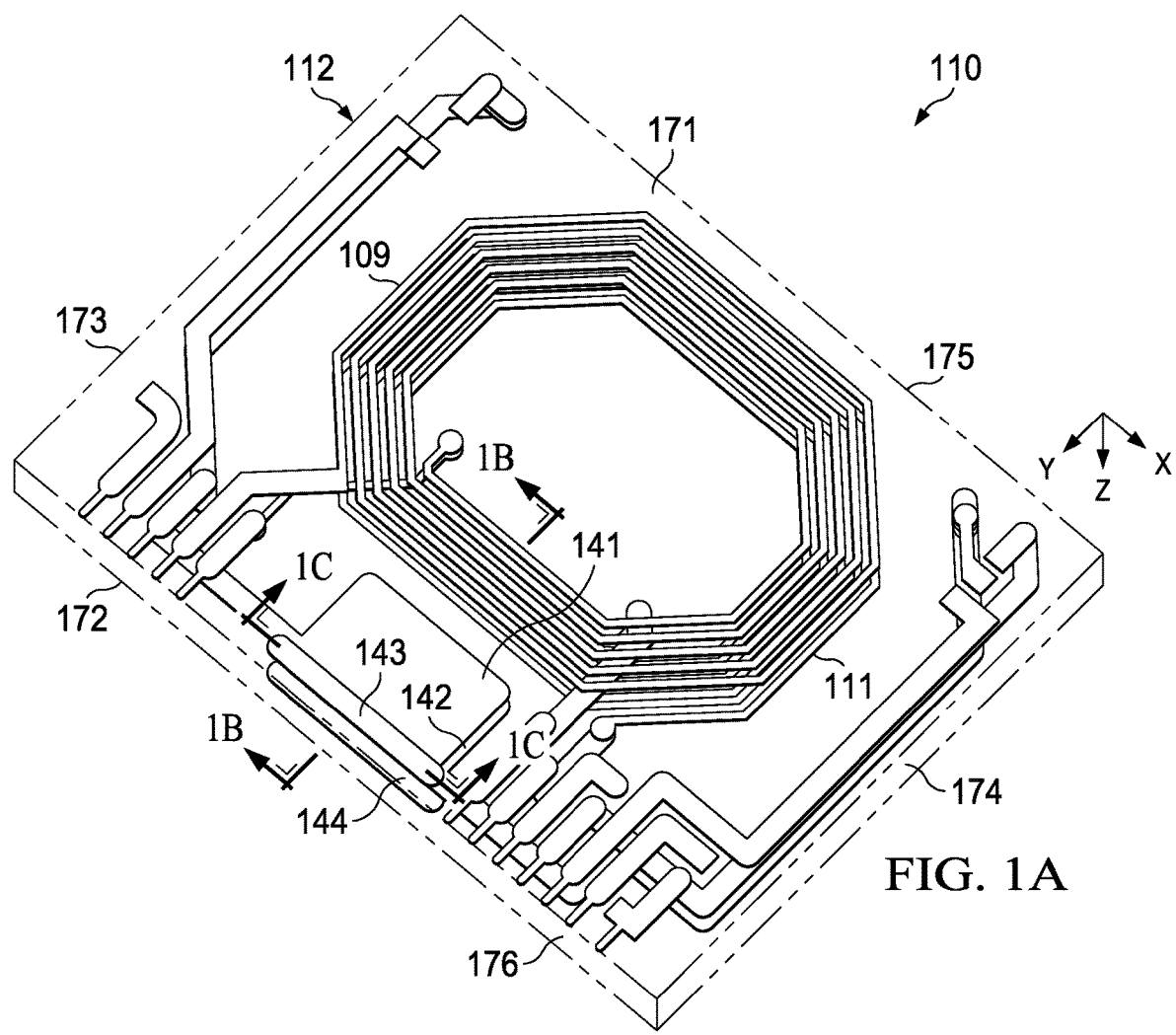
FIG. 1A is a bottom perspective view of the magnetic assembly of FIG. 1.
Figure 1B:
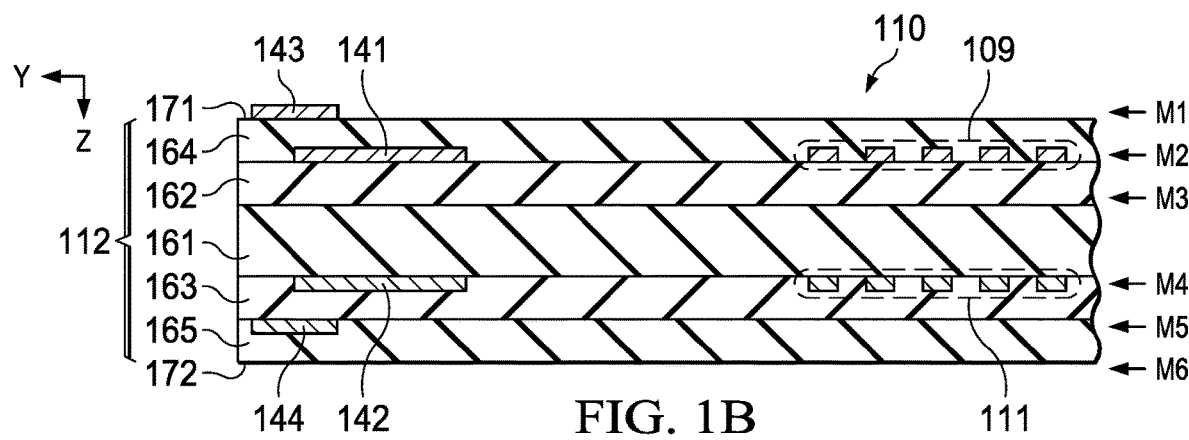
FIG. 1B is a partial sectional end view of the magnetic assembly taken along line 1B-1B of FIG. 1A.

Referring to FIGS. 1-1C, FIG. 1 shows a bottom perspective view of a packaged electronic device 100 with a laminated magnetic assembly having field plates that help mitigate high electric fields and undesired stress within the isolation barrier without increasing the size of the integrated electronic device. FIG. 1A shows a bottom perspective view of the magnetic assembly of FIG. 1, FIG. 1B is a partial sectional end view of the magnetic assembly taken along line 1B-1B of FIG. 1A and FIG. 1C is a partial sectional end view of the magnetic assembly taken along line 1C-1C of FIG. 1A. The integrated field plates facilitate small form factor integrated electronic devices with high voltage isolation for automotive, industrial or other applications in which voltage isolation and small device size are important. The field plate solution can be used in products having symmetric or asymmetric magnetic assembly positioning and provides a scalable solution to accommodate designs with differing electric field levels, efficiency and/or EMI performance specifications. The field plate solution can be implemented in a magnetic assembly mounted with a semiconductor die on a shared die attach pad or the magnetic assembly can be separately mounted on a conductive support structure spaced apart from integrated semiconductor dies and associated conductive die attach pads as in the example of FIG. 1. Field plates can be provided in one or more layers or levels of the multilevel lamination structure and operate to reduce the overall internal field strength within desired design specifications to mitigate undesired stress within the laminate isolation barrier and premature device failure for integrated isolated power products.

The example electronic device 100 has a small outline integrated circuit (SOIC) package type with gull wing leads on opposite first and second sides spaced from one another along a first direction labelled "X" in the drawings. Other packaged electronic devices can be provided in different implementations, including conductive features that can be soldered to another structure or structures for electrical interconnections, such as so called leadless package types (e.g., flat no-leads packages such as quad-flat no-leads (QFN), dual-flat no-leads (DFN), micro lead frame (MLF) and small-outline no leads (SON) types with planar conductive leads such as perimeter lands on the package bottom and/or side that provide electrical connections to a printed circuit board (PCB). In other examples, the device 100 includes a ball grid array (BGA) package or a land grid array (LGA) type, such as a mold array process ball grid array (MAPBGA) or an over-molded BGA (e.g., plastic BGA or PBGA).

The example electronic device 100 of FIGS. 1-1C provides electrical interconnections for first and second electrical circuits, some or all of which are implemented using bond wires. In other implementations, different forms of interconnection types can be used, including substrate-based interconnections (BGA, LGA, etc.), and which a substrate includes electrical interconnections and signal routing structures (e.g., copper or aluminum traces on one or more layers or levels) alone or in combination with bond wire electrical connections. As shown in FIG. 1, the example device 100 includes conductive features (e.g., conductive die attach pads or supports) for mounting and supporting first and second semiconductor dies and a laminated magnetic assembly. The die attach pads and device leads can include any suitable conductive structures, such as copper, aluminum, etc. The example device 100 in FIG. 1 includes a first semiconductor die 102 attached to a first conductive die attach pad 104 of a starting lead frame assembly. The device 100 also includes a second semiconductor die 106 attached to a second conductive die attach pad 108.

The electronic device 100 includes a first circuit associated with a first voltage domain (e.g., a high voltage primary circuit of an integrated power device) as well as a second circuit associated with a second voltage domain (e.g., an isolated lower voltage secondary circuit). A first patterned conductive feature 109 has multiple turns in a magnetic assembly 110 to form a first winding (e.g., a primary winding of an isolation transformer of the first circuit). The second circuit in this example includes a secondary winding formed by a second patterned conductive feature 111 (also referred to as a second winding) of the magnetic assembly 110. The magnetic assembly 110 includes a multilevel lamination structure 112 having the first and second patterned conductive features 109 and 111 as well as conductive capacitor plates and field plates as described further below. In one example, the multilevel lamination structure 112 is or includes a multilevel package structure. The first and second patterned conductive features 109 and 111 each have multiple turns to form respective first and second windings that extend in respective planes of orthogonal first and second directions X and Y in the position illustrated in the figures. The magnetic assembly 110 also includes one or more core structures to facilitate forming a magnetic circuit in combination with the patterned conductive features 109 and 111. The illustrated example includes a first (lower or bottom) magnetic core structure 114. The first magnetic core structure 114 is attached to a first (e.g., bottom) side of the multilevel lamination structure 112.

The packaged electronic device 100 also includes a package structure 120 that encloses the conductive die attach pads 104 and 108, the semiconductor dies 102 and 106, the magnetic assembly 110, and portions of conductive leads of the device 100. In one example, the package structure 120 is or includes a molded material, such as plastic. In another example, the package structure 120 is or includes a ceramic material. The magnetic assembly 110 also includes a second (upper or top) magnetic core structure 121 attached to a second (e.g., top) side of the multilevel lamination structure 112. In one example, the first magnetic core structure 114 is the same size as the second magnetic core structure 121. In another example, the first magnetic core structure 114 is larger than the second magnetic core structure 121. In another example, the first magnetic core structure 114 is smaller than the second magnetic core structure 121. In one example, one or both magnetic core structures 114 and 121 are prefabricated magnetic cores attached using epoxy paste. In another example, one or both magnetic core structures 114 and 121 are fabricated using a thick layer of magnetic paste. The magnetic assembly 110 is attached to a support structure 122 that is integral to the second conductive die attach pad 108. In another implementation, the magnetic assembly 110 is mounted to a support structure (not shown) that is separated and spaced apart from the first and second die attach pads 104 and 108. The packaged electronic device 100 has conductive gull-wing shaped leads 124-131 along one side of the device 100, as well as conductive gull-wing shaped leads 132-139 along an opposite side. The magnetic assembly 110 also includes a capacitor 140 having a first conductive capacitor plate 141 and a second conductive capacitor plate 142 spaced apart from opposite sides of a core layer that provides a capacitor dielectric in the multilevel lamination structure 112.

The multilevel lamination structure 112 also includes first and second conductive field plates 143 and 144 that help mitigate high electric fields and undesired stress within the isolation barrier without increasing the size of the integrated electronic device. The packaged electronic device also includes bond wires 146. A first set of the bond wires 146 interconnect certain of the leads 124-131, the primary winding of the magnetic assembly 110 and the first semiconductor die 102 in a first circuit. A second set of the bond wires 146 interconnect certain of the leads 132-139, the secondary winding of the magnetic assembly 110 and the second semiconductor die 106 in a second circuit. As best shown in FIG. 1, the first conductive die attach pad 104 is directly coupled to a single first lead 125. In other examples, the die attach pad 104 is directly coupled to multiple conductive first leads. In the example device 100, the die attach pad 104 and the lead 125 are a single continuous metal structure, such as copper or aluminum. The second conductive die attach pad 108 is directly coupled to a single lead 138, and the connected support structure 122 is directly connected to a single lead 132. In other examples, the second die attach pad 108 and/or the support structure 122 is/are directly coupled to multiple conductive leads. In the example device 100, the second die attach pad 108, the support structure 122, and the leads 132 and 138 are a single continuous metal structure, such as copper or aluminum. The package structure 120 encloses the die attach pads 104 and 108, and the associated support structure 122. Also, the package structure 120 encloses inner portions of the conductive leads 124-139. The conductive leads 124-139 in one example are so-called gull wing leads that extend downward and outward from the package structure 120. Different types and shapes of conductive leads can be used in other examples (e.g., J leads).

As best shown in FIG. 1, the package structure 120 has respective first and second sides 151 and 152 spaced apart from one another along the first direction (e.g., the X direction). The first conductive leads 124-131 are located along, and extend outward from, the first side 151 of the package structure 120, and the second conductive leads 132-139 are located along, and extend outward from, the second side 152 of the package structure 120.

As shown in the sectional views of FIGS. 1B and 1C, the magnetic assembly 110 includes a multilevel lamination structure 112 having a core layer 161 and dielectric layers 162, 163, 164 and 165, such as laminate layers. The core layer 161 and the dielectric layers 162-165 are or include electrically insulating dielectric material, where the thickness and material of the core layer 161 provides a withstanding voltage according to a desired voltage separation between the first and second circuits for a given design, and the dielectric material and thickness provide a dielectric between the capacitor plates 141 and 142 for the capacitor 140 of the multilevel lamination structure 112.

The conductive features 109, 111, 141, 142, 143 and 144 are formed in one or more of six metal layers M1, M2, M3, M4, M5 and M6 on or between respective ones or pairs of the dielectric layers 162-165 and/or the core layer 161. The core layer 161 and the dielectric layers 162-165 extend in respective planes of the first and second directions X, Y and are stacked along the third direction Z as best shown in the sectional view of FIGS. 1B and 1C. The core layer 161 in one example provides an electrical isolation barrier between the first or primary circuit and an associated first voltage domain, and a second or secondary circuit operating at an associated second voltage domain. The multilevel lamination structure 112 also has one or more conductive vias providing electrical interconnection for routing signals between two or more of the six metal layers M1-M6.

As shown in FIGS. 1B and 1C, the multilevel lamination structure 112 has a Z-direction stack of metal levels M1, M2, M3, M4, M5 and M6 formed on or in or between a core layer 161 and dielectric layers 162-165. The first patterned conductive feature 109 includes multiple turns in the metal layer M2 to form the first winding, and the second patterned conductive feature 111 has multiple turns in the metal layer M4, where the first and second windings are on opposite sides of the core layer 161. In one example, the first patterned conductive feature 109 and the first conductive capacitor plate 141 are formed in the same metal layer M2 as each other, and the second patterned conductive feature 111 and the second conductive capacitor plate 142 are formed in the same metal layer M4 as each other. In this example, the first patterned conductive feature 109 is formed in the second metal layer M2 above the core level 161 and the core layer 161 is positioned between the first and second patterned conductive features 109 and 111 along the third direction Z. In other examples, more or fewer dielectric layers 161-165 can be provided, and more or fewer metal layers can be used. The capacitor plates 141 and 142 are also on opposite sides of the core layer 161 and the capacitor 140 has respective terminals coupled to the first and second circuits on either side of the electrical isolation barrier provided by the core layer 161.

As further shown in FIG. 1A, the multilevel lamination structure 112 has a first or bottom side 171 and a second or top side 172 spaced apart from one another along the third direction Z, lateral sides 173 and 174 spaced apart from one another along the first direction X, and lateral sides 175 and 176 spaced apart from one another along the second direction Y. FIG. 1C further shows example electric field lines 180 and 181 in the multilevel lamination structure 112 during powered operation of the first and second circuits. In the device 100 of FIGS. 1-1C, the first conductive capacitor plate 141 is positioned between the first conductive field plate 143 and the core layer 161 along the third direction Z, and the second conductive capacitor plate 142 is positioned between the second conductive field plate 144 and the core layer 161 along the third direction Z. Also, as best seen in FIGS. 1A-1C, the first conductive field plate 143 in this example has a lateral extent in a first field plate plane of the first and second directions X and Y that extends beyond a lateral extent of the first conductive capacitor plate 141. Also, the second conductive field plate 144 has a lateral extent in a second field plate plane of the first and second directions X and Y that extends beyond a lateral extent of the second conductive capacitor plate 142. In this example, the first conductive field plate 143 extends laterally along the positive Y direction in FIG. 1B beyond the lateral extent of the first conductive capacitor plate 141, and the second conductive field plate 144 extends laterally along the positive Y direction beyond the lateral extent of the second conductive capacitor plate 142.

Also, the first conductive field plate 143 extends laterally along the positive and negative X direction in FIG. 1C beyond the X-direction lateral extent of the first conductive capacitor plate 141, and the same is true of the second conductive field plate 144 and the second conductive capacitor plate 142. As further shown in FIG. 1C, the relative positioning of the conductive field plates 143 and 144, the conductive capacitor plates 141 and 142 and the windings mitigates excessive electric field strength in the core layer 161 and the other layers 162-165 of the multilevel lamination structure 112 to prevent or inhibit stress and/or premature damage or degradation of the voltage withstand capability of the packaged electronic device 100 during operation. For example, the voltage of the first patterned conductive feature 109 and metal structures above the core layer 161 can be much higher than the voltage of the second patterned conductive feature 114 and other metal structures below the isolation boundary of the core layer 161. FIG. 1C shows example electric field lines 180, 181, 182 and 183 that extend partially in the core layer 161 as shown.

In one implementation, the capacitor 140 is connected to one or both of the first and second circuits, for example with the first conductive capacitor plate 141 coupled to a conductive feature of the first semiconductor die 102 or other node of the first (e.g., primary) circuit, and the second conductive capacitor plate 142 coupled to a conductive feature of the second semiconductor die 106 or other node of the second (e.g., secondary) circuit. In one implementation, one or both the conductive field plates 143 and/or 144 is/are electrically floating. In another implementation, one or both conductive field plates 143 and/or 144 is/are coupled to a reference voltage node or a node of the first or second circuits. In one example, the first conductive field plate 143 is coupled to a circuit node of the first circuit and the second conductive field plate 144 is coupled to a circuit node of the second circuit. The conductive field plates 143 and 144 operate as electric field grading plates over high field generating layers such as the respective capacitor plates to lower fields in the isolation barrier.

Figure 2:
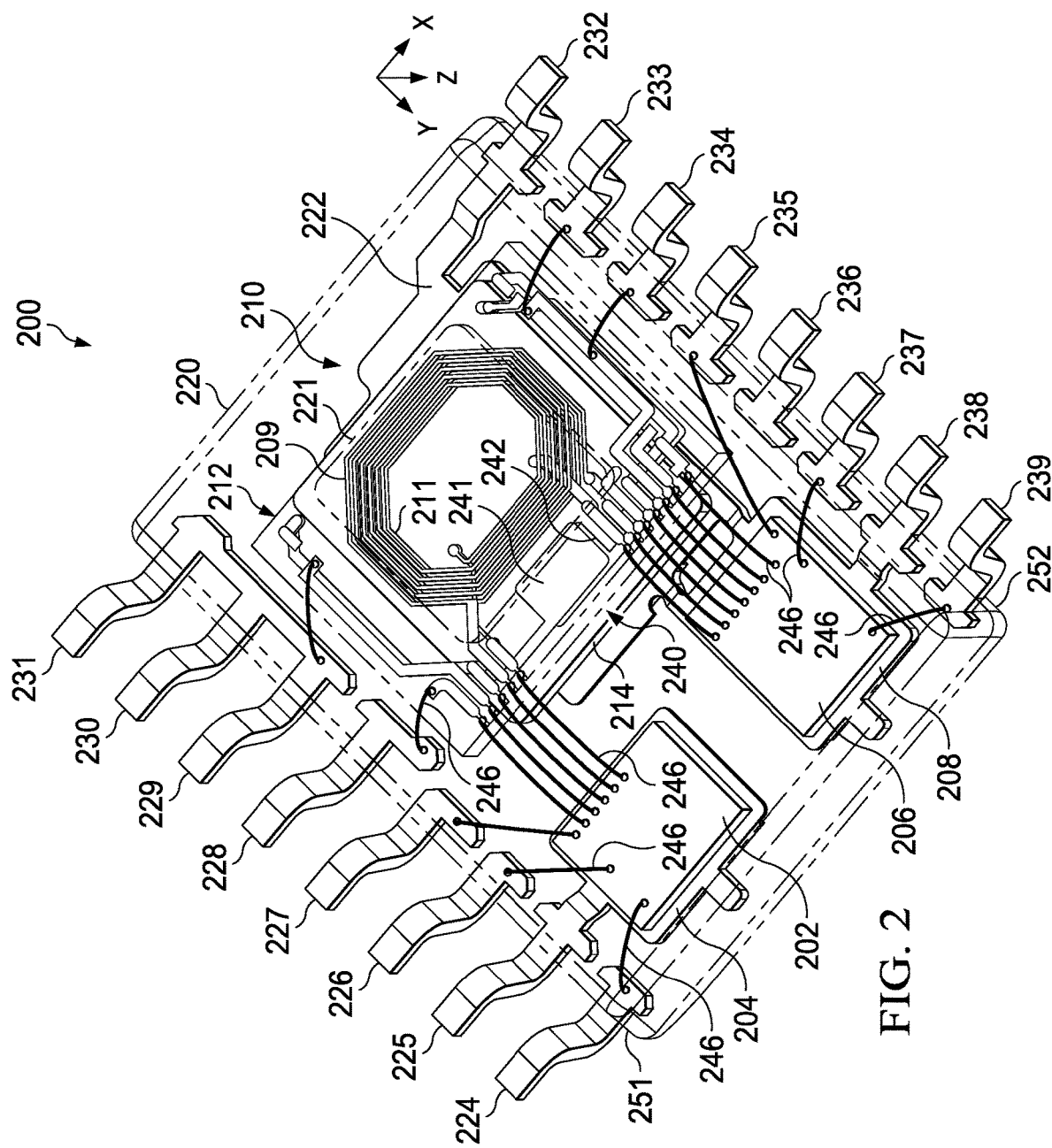
FIG. 2 is a bottom perspective view of another packaged electronic device that includes another magnetic assembly.

Referring also to FIGS. 2 and 3, FIG. 2 shows a bottom perspective view of a packaged electronic device 200 with a laminated magnetic assembly of similar construction with capacitor plates and coil windings but without field plates above or below the capacitor plates, and FIG. 3 shows comparative stressed volume performance of the magnetic assemblies of FIGS. 1 and 2 as a function of the applied electric field. The electronic device 200 in FIG. 2 has a first semiconductor die 202 attached to a first conductive die attach pad 204 of a starting lead frame assembly. The device 200 also includes a second semiconductor die 206 attached to a second conductive die attach pad 208. The electronic device 200 includes a first patterned conductive feature 209 with multiple turns in a magnetic assembly 210 to form a first winding, and a second circuit includes a secondary winding formed by a second patterned conductive feature 211 of the magnetic assembly 210.

The magnetic assembly 210 includes a multilevel lamination structure 212 having the first and second patterned conductive features 209 and 211 as well as conductive capacitor plates. The magnetic assembly 210 also includes a first magnetic core structure 214 attached to the bottom the multilevel lamination structure 212 and a second magnetic core structure 221 attached to the top of the multilevel lamination structure 212. In one example, the multilevel lamination structure 212 is or includes a multilevel package structure. The packaged electronic device 200 also includes a package structure 220 that encloses the conductive die attach pads 204 and 208, the semiconductor dies 202 and 206, the magnetic assembly 210, and portions of conductive leads of the device 200. The magnetic assembly 210 is attached to a support structure 222 that is integral to the second conductive die attach pad 208. In another implementation, the magnetic assembly 210 is mounted to a support structure (not shown) that is separated and spaced apart from the first and second die attach pads 204 and 208.

The packaged electronic device 200 has conductive gull-wing shaped leads 224-231 along one side of the device 200, as well as conductive gull-wing shaped leads 232-239 along an opposite side. The magnetic assembly 210 also includes a capacitor 240 having a first conductive capacitor plate 241 and a second conductive capacitor plate 242 spaced apart from opposite sides of a core layer that provides a capacitor dielectric in the multilevel lamination structure 212. The packaged electronic device also includes bond wires 246. The package structure 220 has first and second sides 251 and 252, where the first conductive leads 224-231 are located along, and extend outward from, the first side 251, and the second conductive leads 232-239 are located along, and extend outward from, the second side 252.

A graph 300 in FIG. 3 shows stressed volume ($S_V$ in mm$^3$) as a function of applied electric field strength for the respective magnetic assemblies 110 and 210 of FIGS. 1 and 2, where the X-axis field strength is shown as a ratio $\alpha$ ($E/E_0$). A first curve 301 in FIG. 3 shows the stressed volume performance ($S_V$) of the magnetic assembly 110 with the field plates 143 and 144, and a second curve 302 shows the stressed volume performance ($S_V$) of the magnetic assembly 210 of FIG. 2 without field plates. The curve 301 demonstrates lower stressed volume by the inclusion of the field plates 143 and 144 in the magnetic assembly 110.

Figure 4A:
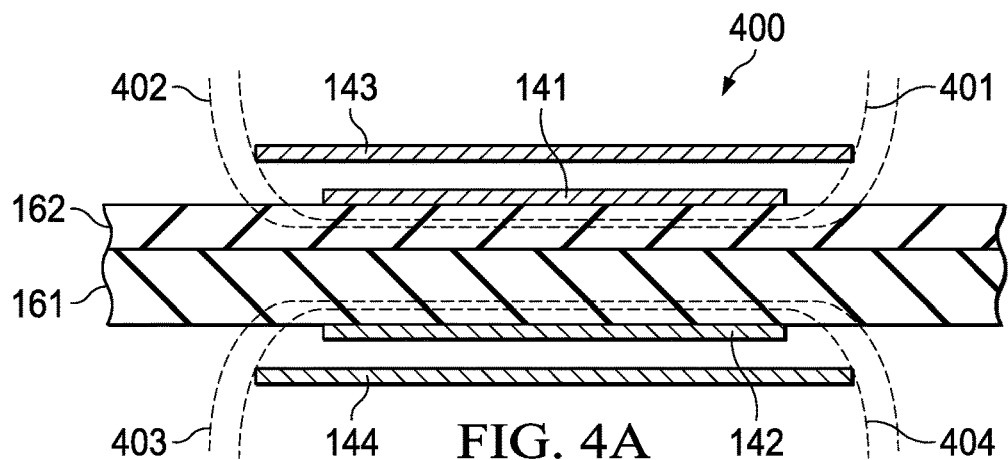
FIGS. 4A-4F are simplified side elevation views of several examples of capacitor plate and conductive field plate configurations with electric field lines.
Figure 4B:
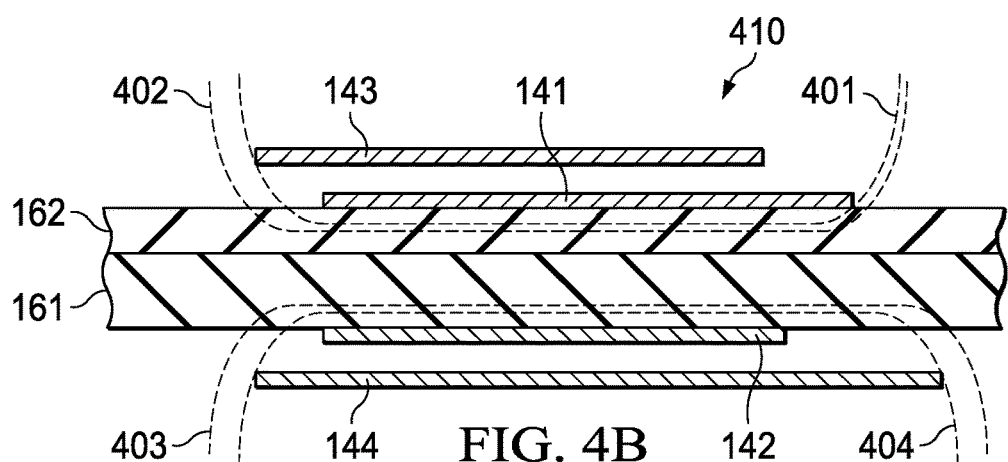
Figure 4C:
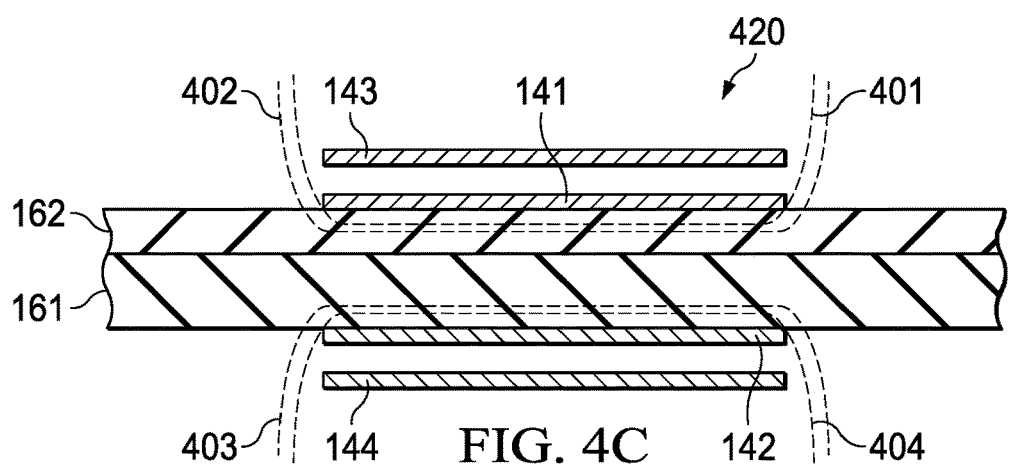
Figure 4D:
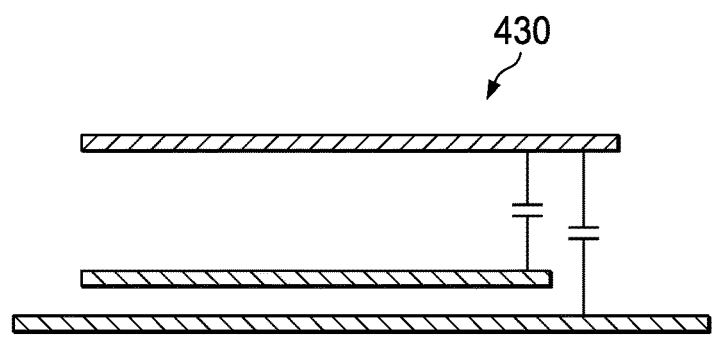
Figure 4E:
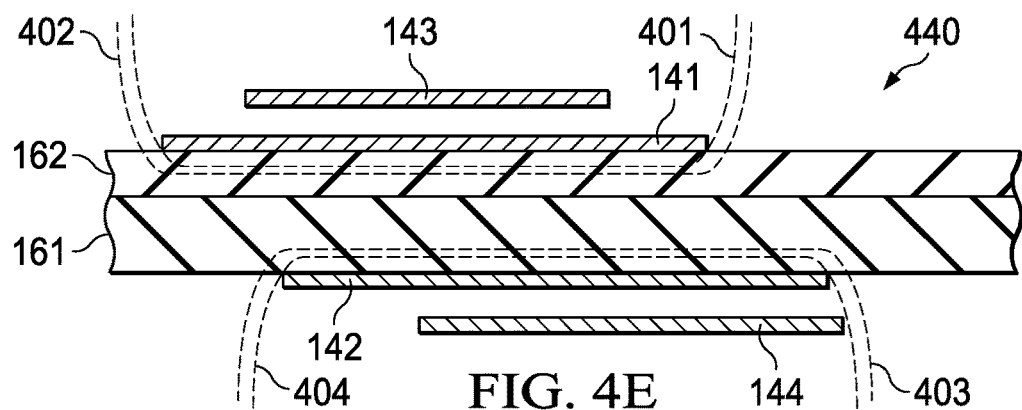
Figure 4F:
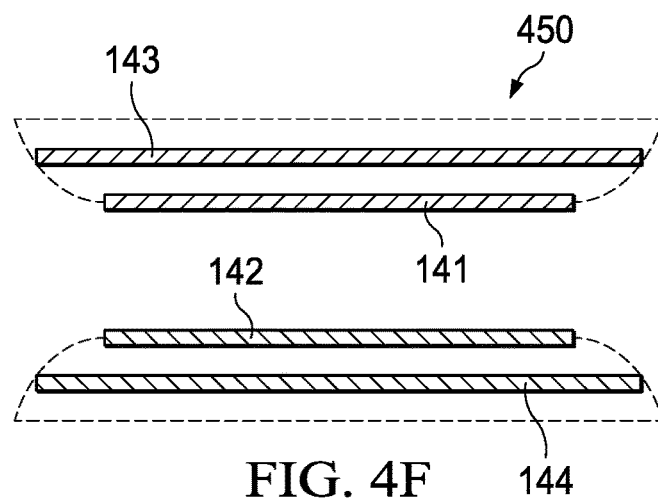
Figure 5:
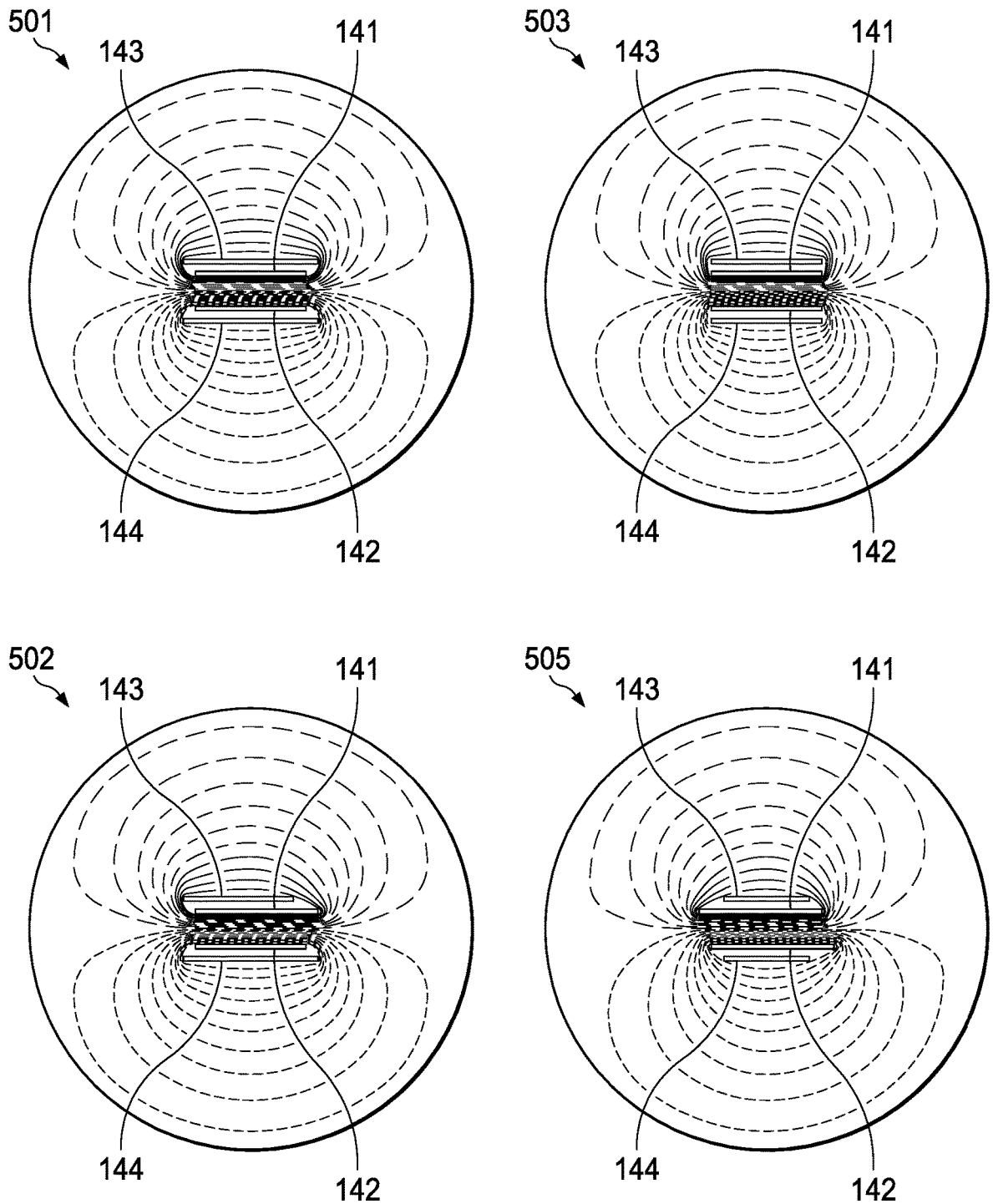
FIG. 5 is a partial side elevation view with simulated electric field lines of four example capacitor plate and conductive field plate configurations.
Figure 6:
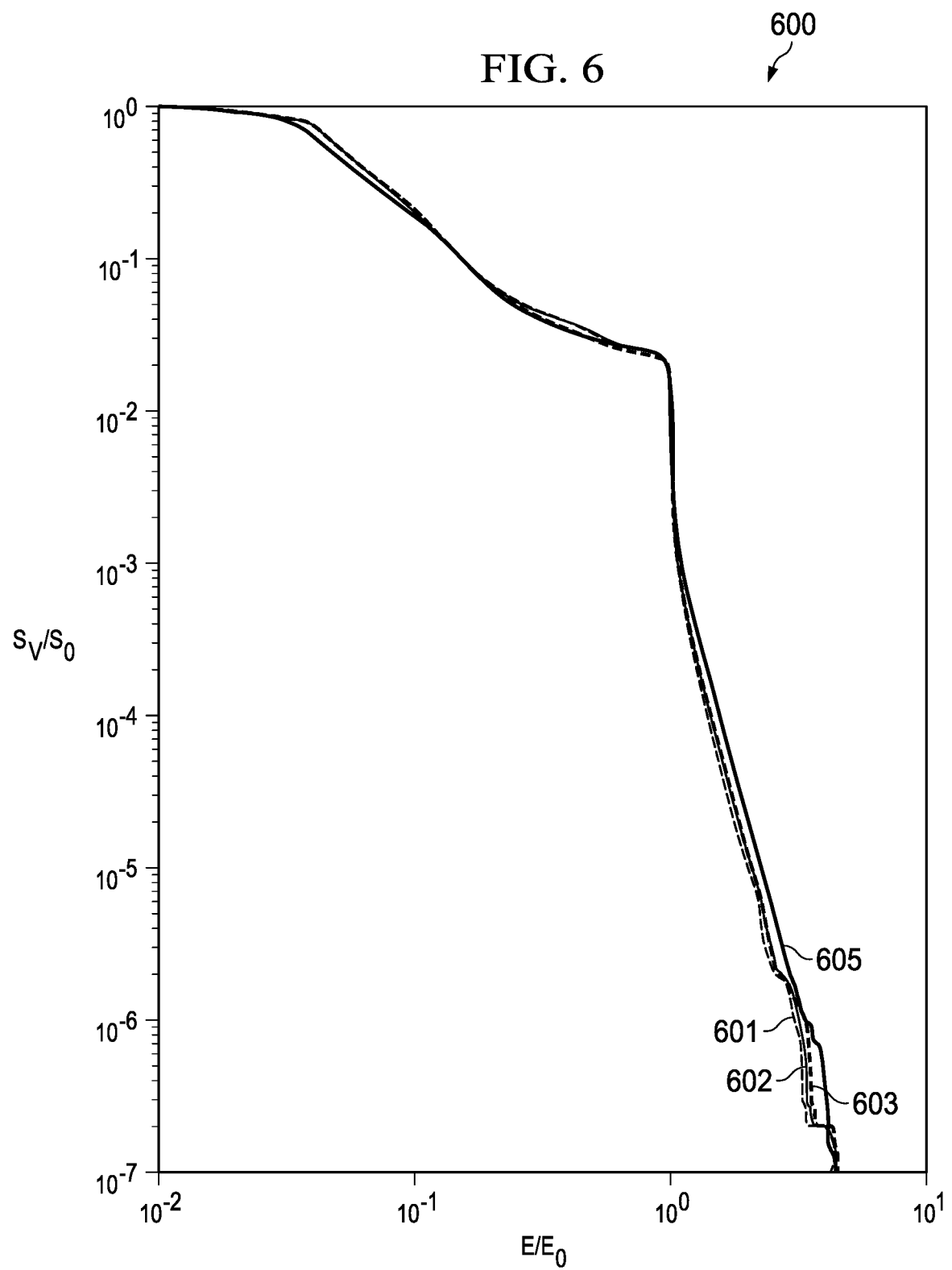
FIGS. 6 and 6A are graphs of stressed volume as a function of applied electric field strength for the four example capacitor plate and conductive field plate configurations of FIG. 5.
Figure 6A:
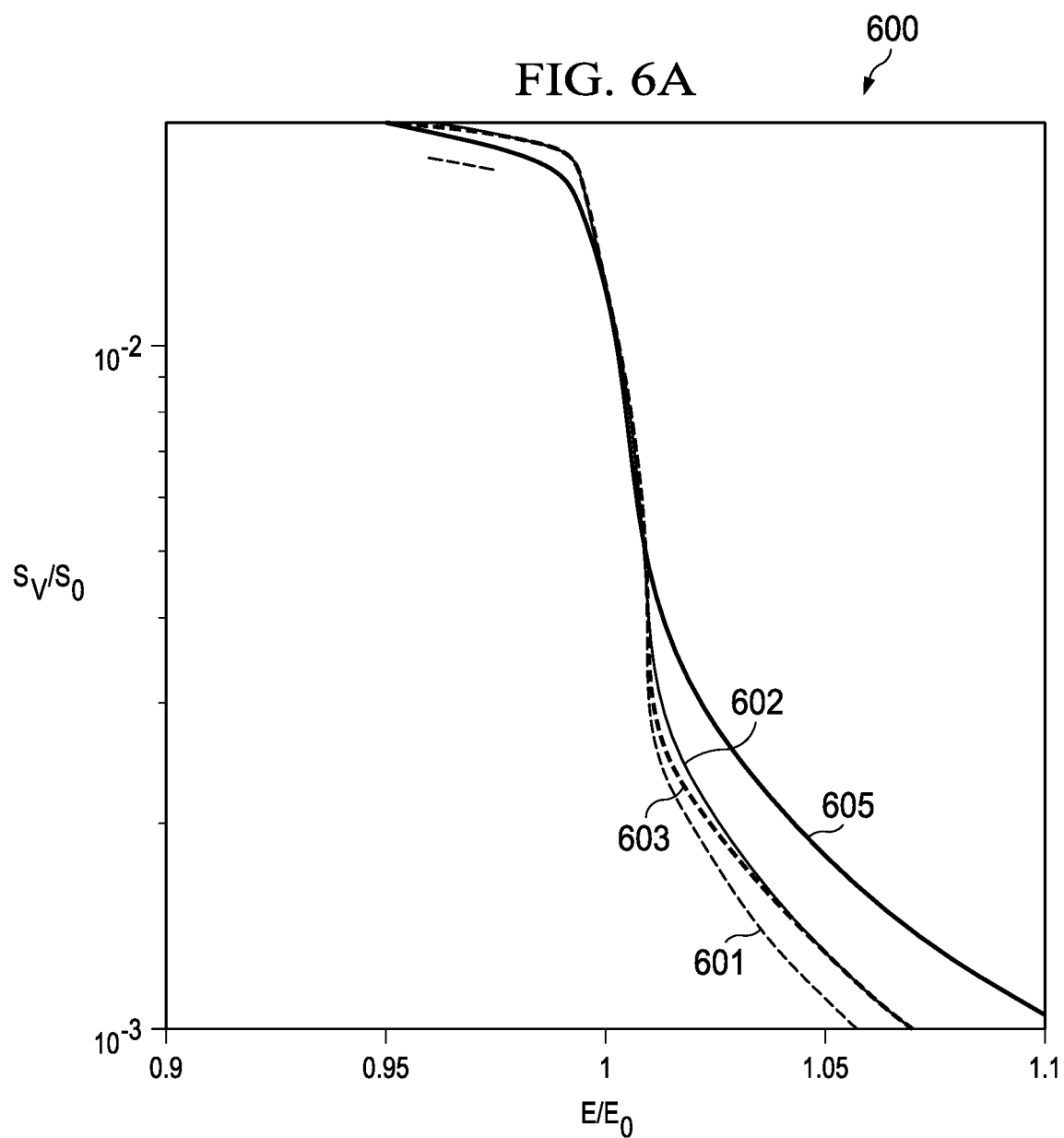

Referring also to FIGS. 4A-6A, FIGS. 4A-4F show simplified side elevation views of several example configurations and arrangements of the capacitor plates 141 and 142, the layers 161 and 163, and the conductive field plates 143 and 144 with electric field lines in different implementations of the electronic device 100 and magnetic assembly 110 of FIG. 1 above. FIG. 5 is a partial side elevation view with simulated electric field lines of four example capacitor plate and conductive field plate configurations, and FIGS. 6 and 6A show graphs of stressed volume performance ($S_V$) of the example configurations of FIG. 5 as a function of applied electric field strength. FIGS. 4A-4F show respective configurations labeled 400, 410, 420, 430, 440 and 450, some of which include electric field strength lines 401, 402, 403 and 404. The examples illustrate different approaches to have lower electric fields in the multilevel lamination structure 110, and the configuration 430 in FIG. 4D shows capacitance sharing principles that influence the stressed volume performance ($S_V$) of the multilevel lamination structure 112.

As seen in FIGS. 4A-4F, low electric field performance is facilitated by field plates 143 and 144 respectively over and below the isolation barrier, and preferably overhanging with a lateral extend beyond that of the respective capacitor plates 141 and 142 as discussed above in connection with FIGS. 1B and 1C, for example, to create tapered steps as shown in the examples 400 and 410 in FIGS. 4A and 4B, respectively, and similar to the profiled electrode shapes shown in the example configuration 450 of FIG. 4F. In this example, the arrangement or configuration 420 in FIG. 4C and the arrangement 440 in FIG. 4E have poorer stressed volume performance ($S_V$) due to high field concentration at the metal layer corners. FIG. 5 shows simulated electric field lines for four example configurations 501, 502, 503 and 504 of the conductive capacitor plates 141 and 142 and the conductive field plates 143 and 144 that respectively correspond to the configurations 400, 410, 420 and 440 of FIGS. 4A, 4B, 4C and 4E above.

FIG. 6 shows a graph 600 with curves 601, 602, 603 and 605 of stressed volume performance ($S_V/S_0$) as a function of electric field strength ($E/E_0$) corresponding respectively to the configurations 400, 410, 420 and 440 of FIGS. 4A, 4B, 4C and 4E and to the configurations 501, 502, 503 and 505 of FIG. 5 above. FIG. 6A shows a portion of the graph 600 of FIG. 6 over a smaller range of electric field strength ($E/E_0$) from 0.9 to 1.1 to further illustrate the best performance (e.g., lowest stressed volume performance $S_V/S_0$) shown by the curve 601 (e.g., configuration 400 in FIG. 4A and configuration 501 in FIG. 5), followed by the progressively less effective configurations 410, 420 and 440 of FIGS. 4A, 4B, 4C and 4E and 502, 503 and 505 of FIG. 5 above.

In the example implementation 112 of FIGS. 1-1C, like the respective configurations 400 and 501 of FIGS. 4A and 5 provide both partial overhang of the field plates 143 and 144 respectively over and below outer portions of the respective capacitor plates 141 and 142, and lateral extent outward beyond the lateral ends of the respective capacitor plates 141 and 142 to facilitate shaping of the electric field lines to mitigate undesirable stress and potential damage or degradation of the dielectric layers 161-165 while allowing small form factor device sizes without needing to make the core layer 161 or the other layers 162-165 thicker.

Figure 7:
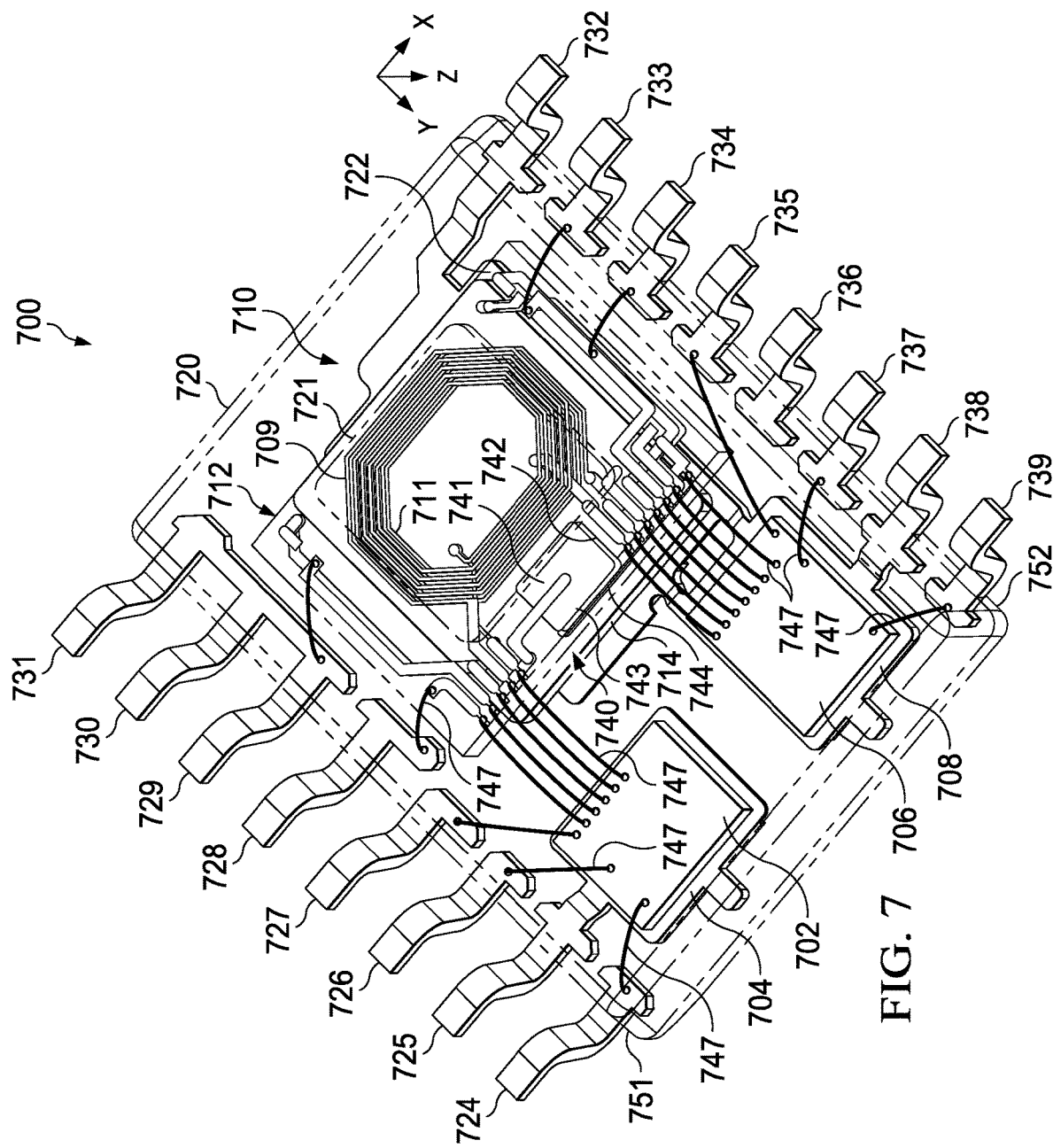
FIG. 7 is a bottom perspective view of another packaged electronic device that includes a magnetic assembly having coil windings, capacitor plates and conductive field plates with via connections.
Figure 7A:
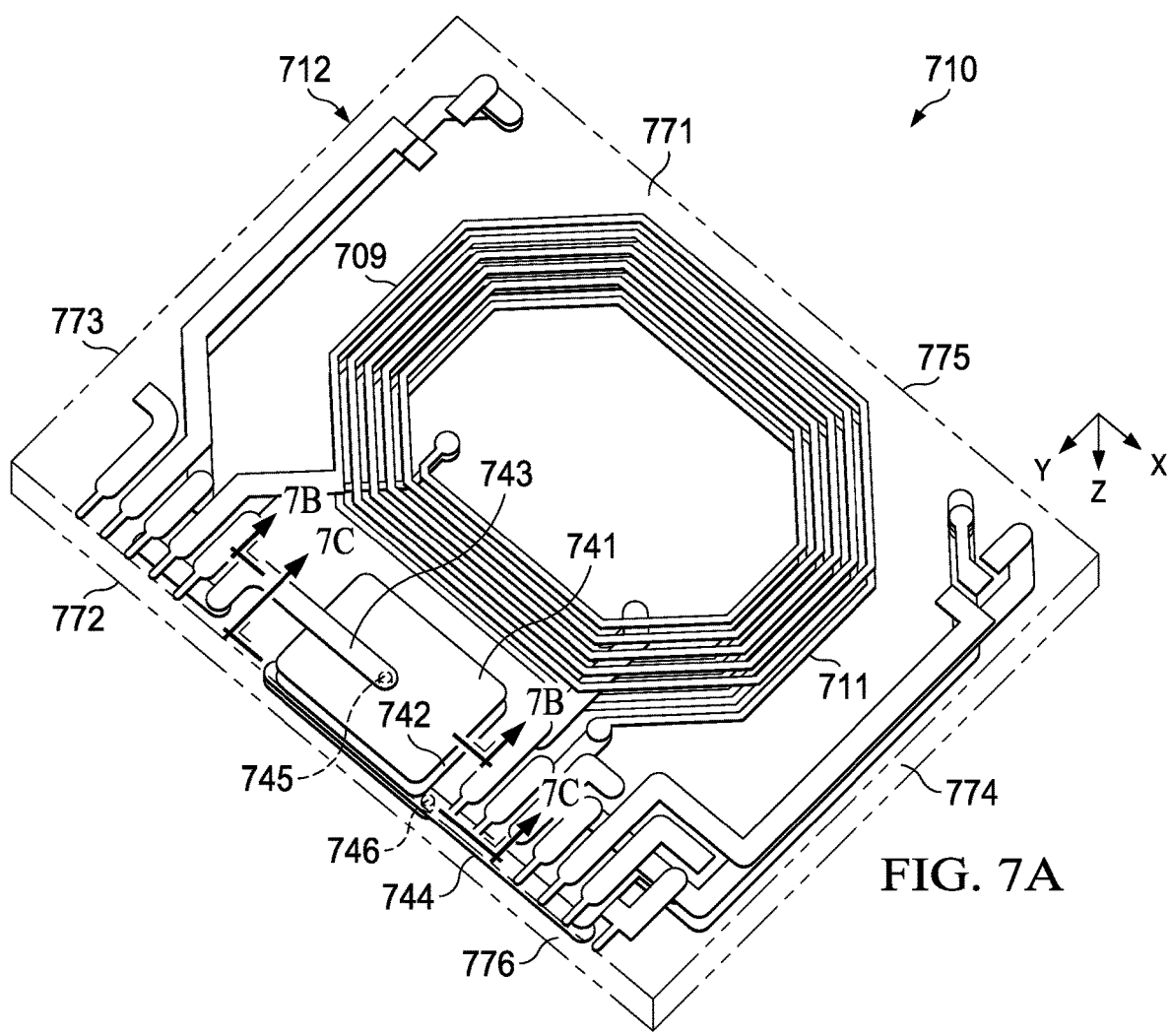
FIG. 7A is a bottom perspective view of the magnetic assembly of FIG. 7.
Figure 7B:
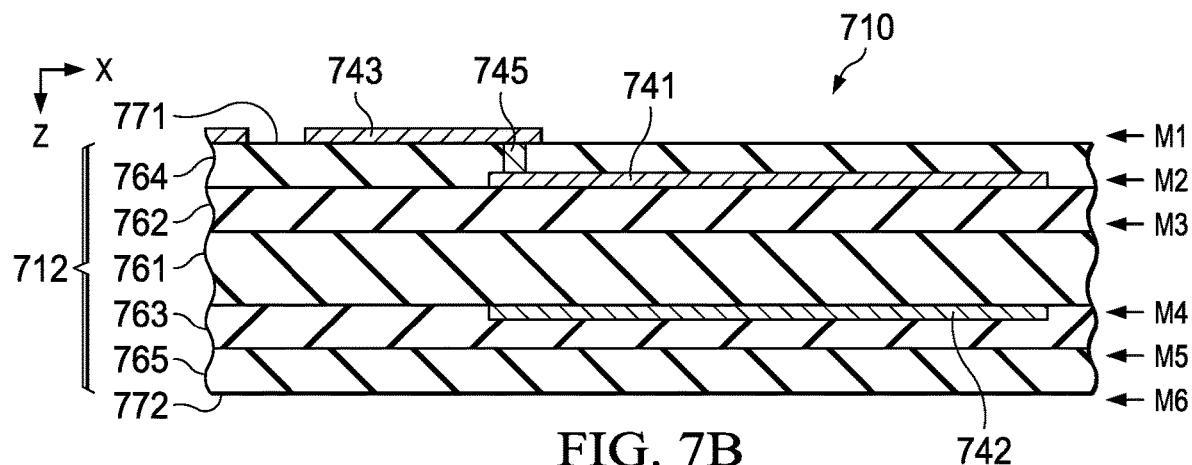
FIG. 7B is a partial sectional end view of the magnetic assembly taken along line 7B-7B of FIG. 7A.
Figure 7C:
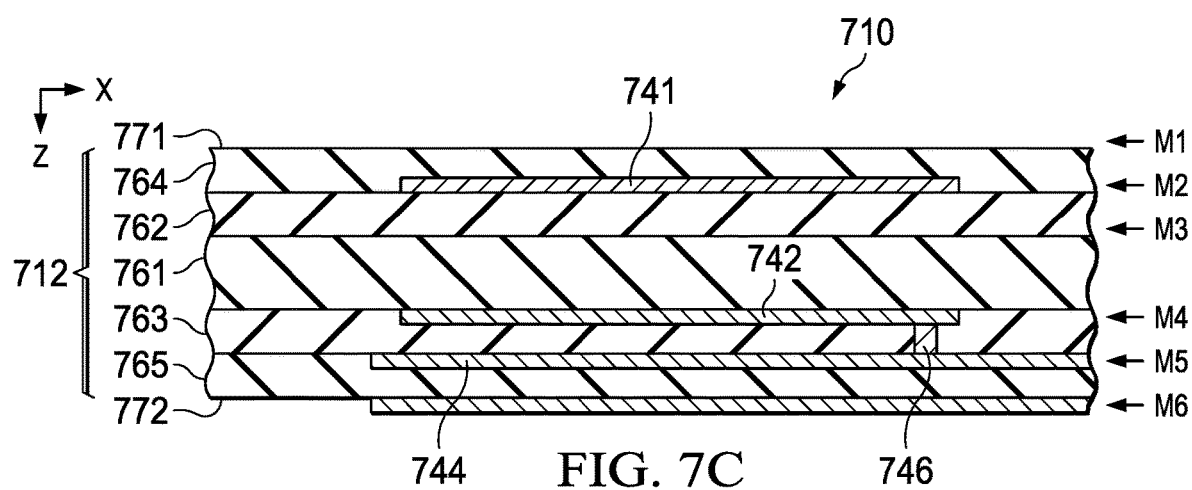
FIG. 7C is another partial sectional end view of the magnetic assembly taken along line 7C-7C of FIG. 7A.

Referring now to FIGS. 7-7C, another example improves the stressed volume performance (e.g., $S_V/S_0$) by incorporating conductive vias that coupled conductive field plates to other conductive features in a multilevel lamination structure to reduce or avoid degradation or damage without increasing the device size or form factor. The via connection from top and bottom to large metal structures allows a large space between structures of opposite polarities and avoids or mitigates overlapping routing of structures of different voltage potentials across the isolation barrier.

FIG. 7 shows a bottom perspective view of another packaged electronic device 700 that includes a magnetic assembly having coil windings, capacitor plates and conductive field plates with via connections. FIG. 7A shows a bottom perspective view of the magnetic assembly of FIG. 7, FIG. 7B shows a partial sectional end view of the magnetic assembly taken along line 7B-7B of FIG. 7A and FIG. 7C shows another partial sectional end view of the magnetic assembly taken along line 7C-7C of FIG. 7A.

The example electronic device 700 has an SOIC package form with gull wing leads on opposite sides to allow electrical interconnection for first and second electrical circuits. The packaged electronic device 700 includes a first semiconductor die 702 attached to a first conductive die attach pad 704 of a starting lead frame assembly, as well as a second semiconductor die 706 attached to a second conductive die attach pad 708. The electronic device 700 includes a first circuit associated with a first voltage and a second circuit associated with a second voltage domain. A first patterned conductive feature 709 has multiple turns in a magnetic assembly 710 to form a first winding (e.g., a primary winding) in the first circuit. The second circuit includes a secondary winding formed by a second patterned conductive feature 711 (e.g., a second winding) of the magnetic assembly 710. The magnetic assembly 710 includes a multilevel lamination structure 712 having the first and second patterned conductive features 709 and 711 as well as conductive capacitor plates and field plates. In one example, the multilevel lamination structure 712 is or includes a multilevel package structure. The first and second patterned conductive features 709 and 711 each have multiple turns to form respective first and second windings that extend in respective X-Y planes. The magnetic assembly 710 also includes a first magnetic core structure 714 attached to the bottom side of the multilevel lamination structure 712. The packaged electronic device 700 also includes a package structure 720 that encloses the conductive die attach pads 704 and 708, the semiconductor dies 702 and 706, the magnetic assembly 710, and portions of conductive leads of the device 700. The magnetic assembly 710 also includes a second (upper or top) magnetic core structure 721 attached to a second (e.g., top) side of the multilevel lamination structure 712.

The magnetic assembly 710 is attached to a support structure 722 that is integral to the second conductive die attach pad 708. The packaged electronic device 700 has conductive gull-wing shaped leads 724-731 along one side of the device 700, as well as conductive gull-wing shaped leads 732-739 along an opposite side. The magnetic assembly 710 also includes a capacitor 740 having a first conductive capacitor plate 741 and a second conductive capacitor plate 742 spaced apart from opposite sides of a core layer that provides a capacitor dielectric in the multilevel lamination structure 712.

The multilevel lamination structure 712 also includes respective first and second conductive field plates 743 and 744 that help mitigate high electric fields and undesired stress within the isolation barrier without increasing the size of the integrated electronic device. The packaged electronic device also includes bond wires 747. A first set of the bond wires 747 interconnect certain of the leads 724-731, the primary winding of the magnetic assembly 710 and the first semiconductor die 702 in a first circuit. A second set of the bond wires 747 interconnect certain of the leads 732-739, the secondary winding of the magnetic assembly 710 and the second semiconductor die 706 in a second circuit. The package structure 720 encloses the die attach pads 704 and 708, and the associated support structure 722, as well as inner portions of the conductive leads 724-739. The package structure 720 has respective first and second sides 751 and 752, wherein the first conductive leads 724-731 are located along, and extend outward from, the first side 751 of the package structure 720, and the second conductive leads 732-739 are located along, and extend outward from, the second side 752 of the package structure 720.

The magnetic assembly 710 includes a multilevel lamination structure 712 having a core layer 761 as well as dielectric layers 762, 763, 764 and 765 (e.g., FIGS. 7B and 7C). The core layer 761 and the dielectric layers 762-765 are or include electrically insulating dielectric material, where the thickness and material of the core layer 761 provides a withstanding voltage according to a desired voltage separation between the first and second circuits for a given design, and the dielectric material and thickness provide a dielectric between the capacitor plates 741 and 742 for the capacitor 740 of the multilevel lamination structure 712. The conductive features 709, 711, 741, 742, 743 and 744 are formed in one or more of six metal layers M1, M2, M3, M4, M5 and M6 on or between respective ones or pairs of the dielectric layers 762-765 and/or the core layer 761. The core layer 761 and the dielectric layers 762-765 extend in respective X-Y planes and are stacked along the third direction Z. The core layer 761 in one example provides and electrical isolation barrier between the first or primary circuit and an associated first voltage domain, and a second or secondary circuit operating at an associated second voltage domain.

The multilevel lamination structure 712 also has one or more conductive vias, including a first conductive via 745 in FIG. 7B and a second conductive via 746 in FIG. 7C. The vias provide electrical interconnection for routing signals between two or more of the six metal layers M1-M6. In this example, the first conductive via 745 is coupled between the first conductive capacitor plate 741 and the first conductive field plate 743, and the second conductive via 746 is coupled between the second conductive capacitor plate 742 and the second conductive field plate 743. The multilevel lamination structure 712 has a Z-direction stack of metal levels M1, M2, M3, M4, M5 and M6 formed on or in or between the core layer 761 and the dielectric layers 762-765. The first patterned conductive feature 709 includes multiple turns in the metal layer M2 to form the first winding, and the second patterned conductive feature 711 has multiple turns in the metal layer M4, where the first and second windings are on opposite sides of the core layer 761. In one example, the first patterned conductive feature 709 and the first conductive capacitor plate 741 are formed in the same metal layer M2 as each other, and the second patterned conductive feature 711 and the second conductive capacitor plate 742 are formed in the same metal layer M4 as each other. In this example, the first patterned conductive feature 709 is formed in the second metal layer M2 above the core level 761 and the core layer 761 is positioned between the first and second patterned conductive features 709 and 711 along the third direction Z. In other examples, more or fewer dielectric layers 761-765 can be provided, and more or fewer metal layers can be used. The capacitor plates 741 and 742 are also on opposite sides of the core layer 761 and the capacitor 740 has respective terminals coupled to the first and second circuits on either side of the electrical isolation barrier provided by the core layer 761.

As further shown in FIG. 7A, the multilevel lamination structure 712 has a first or bottom side 771 and a second or top side 772 spaced apart from one another along the third direction Z, lateral sides 773 and 774 spaced apart from one another along the first direction X, and lateral sides 775 and 776 spaced apart from one another along the second direction Y. The first conductive capacitor plate 741 is positioned between the first conductive field plate 743 and the core layer 761 along the third direction Z, and the second conductive capacitor plate 742 is positioned between the second conductive field plate 744 and the core layer 761 along the third direction Z. Also, as best seen in FIGS. 7A-7C, the first conductive field plate 743 in this example has a lateral extent in a first field plate plane of the first and second directions X and Y that extends beyond a lateral extent of the first conductive capacitor plate 741. Also, the second conductive field plate 744 has a lateral extent in a second field plate plane of the first and second directions X and Y that extends beyond a lateral extent of the second conductive capacitor plate 742. In this example, the first conductive field plate 743 extends laterally along the positive Y direction in FIG. 7B beyond the lateral extent of the first conductive capacitor plate 741, and the second conductive field plate 744 extends laterally along the positive Y direction beyond the lateral extent of the second conductive capacitor plate 742.

Also, the first conductive field plate 743 extends laterally along the positive and negative X direction in FIG. 7C beyond the X-direction lateral extent of the first conductive capacitor plate 741, and the same is true of the second conductive field plate 744 and the second conductive capacitor plate 742. As further shown in FIG. 7C, the relative positioning of the conductive field plates 743 and 744, the conductive capacitor plates 741 and 742 and the windings mitigates excessive electric field strength in the core layer 761 and the other layers 762-765 of the multilevel lamination structure 712 to prevent or inhibit stress and/or premature damage or degradation of the voltage withstand capability of the packaged electronic device 700 during operation. For example, the voltage of the first patterned conductive feature 709 and metal structures above the core layer 761 can be much higher than the voltage of the second patterned conductive feature 714 and other metal structures below the isolation boundary of the core layer 761.

In one implementation, the capacitor 740 is connected to one or both the first and second circuits, for example with the first conductive capacitor plate 741 coupled to a conductive feature of the first semiconductor die 702 or other node of the first (e.g., primary) circuit, and the second conductive capacitor plate 742 coupled to a conductive feature of the second semiconductor die 706 or other node of the second (e.g., secondary) circuit. In one implementation, one or both the conductive field plates 743 and/or 744 is/are electrically floating. In another implementation, one or both conductive field plates 743 and/or 744 is/are coupled to a reference voltage node or a node of the first or second circuits. In one example, the first conductive field plate 743 is coupled to a circuit node of the first circuit and the second conductive field plate 744 is coupled to a circuit node of the second circuit.

Figure 8:
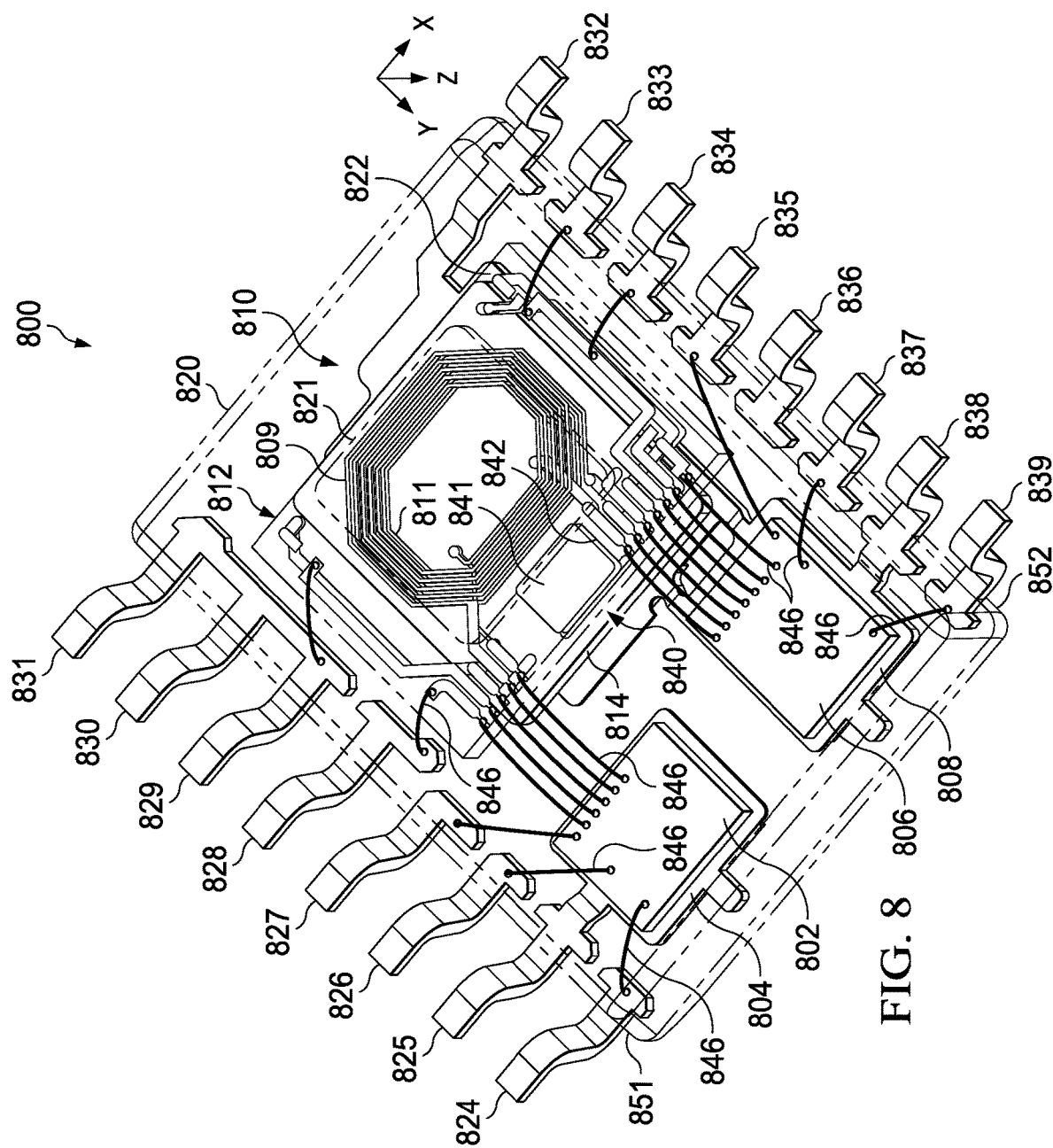
FIG. 8 is a bottom perspective view of another packaged electronic device that includes another magnetic assembly.
Figure 9:
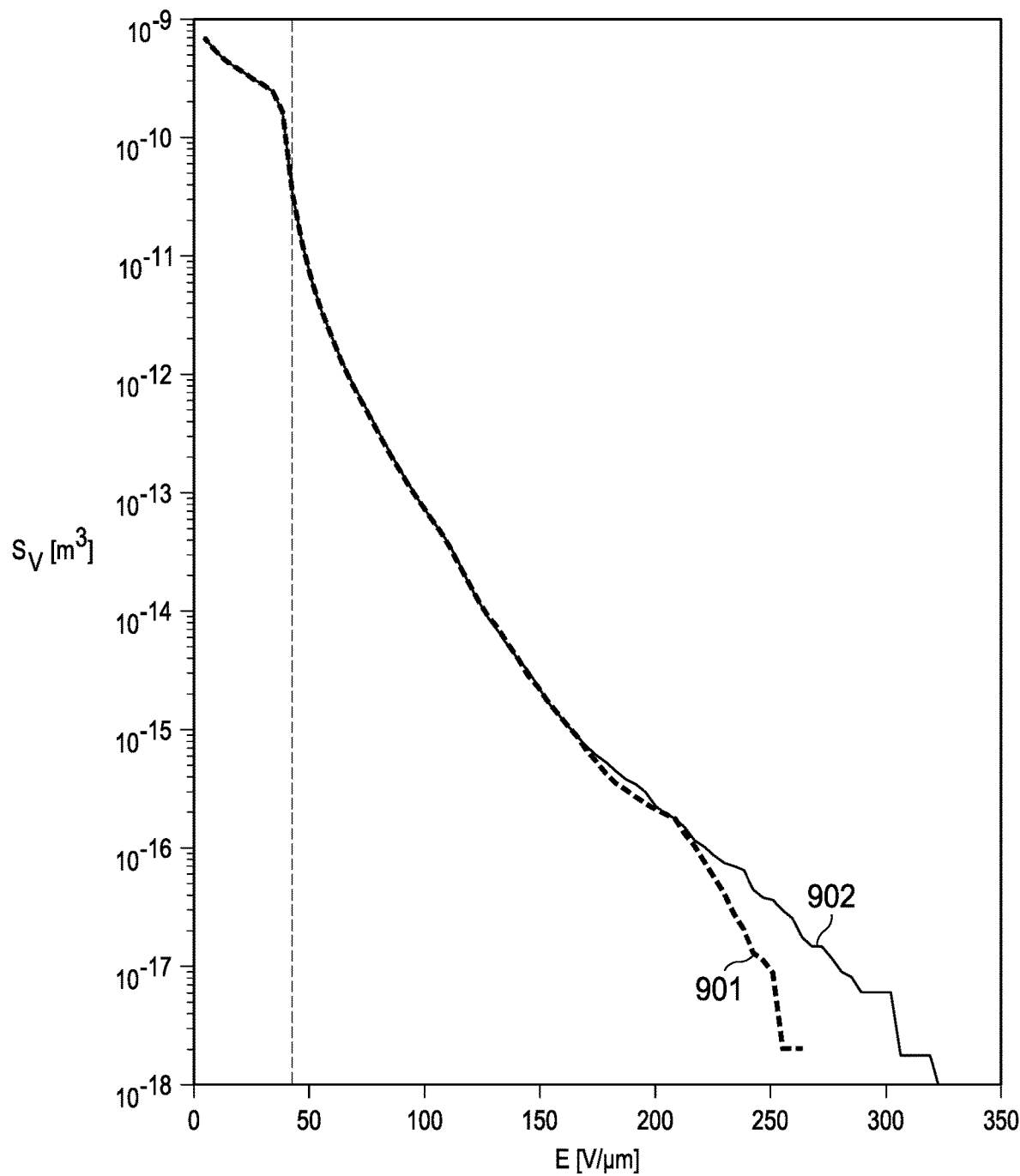
FIG. 9 is a graph of stressed volume as a function of applied electric field strength for the magnetic assemblies of FIGS. 7 and 8.

Referring also to FIGS. 8 and 9, FIG. 8 shows a bottom perspective view of a packaged electronic device 800 with a laminated magnetic assembly of similar construction with capacitor plates and coil windings but without field plates, and FIG. 9 shows comparative stressed volume performance of the magnetic assemblies of FIGS. 7 and 8 as a function of the applied electric field. The electronic device 800 in FIG. 8 has a first semiconductor die 802 attached to a first conductive die attach pad 804 of a starting lead frame assembly. The device 800 also includes a second semiconductor die 806 attached to a second conductive die attach pad 808. The electronic device 800 includes a first patterned conductive feature 809 with multiple turns in a magnetic assembly 810 to form a first winding, and a second circuit includes a secondary winding formed by a second patterned conductive feature 811 of the magnetic assembly 810.

The magnetic assembly 810 includes a multilevel lamination structure 812 having the first and second patterned conductive features 809 and 811 as well as conductive capacitor plates. In one example, the multilevel lamination structure 812 is or includes a multilevel package structure. The magnetic assembly 810 also includes a first magnetic core structure 814 attached to the bottom the multilevel lamination structure 812 and a second magnetic core structure 821 attached to the top of the multilevel lamination structure 812. The packaged electronic device 800 also includes a package structure 820 that encloses the conductive die attach pads 804 and 808, the semiconductor dies 802 and 806, the magnetic assembly 810, and portions of conductive leads of the device 800. The magnetic assembly 810 is attached to a support structure 822 that is integral to the second conductive die attach pad 808. In another implementation, the magnetic assembly 810 is mounted to a support structure (not shown) that is separated and spaced apart from the first and second die attach pads 804 and 808.

The packaged electronic device 800 has conductive gull-wing shaped leads 824-831 along one side of the device 800, as well as conductive gull-wing shaped leads 832-839 along an opposite side. The magnetic assembly 810 also includes a capacitor 840 having a first conductive capacitor plate 841 and a second conductive capacitor plate 842 spaced apart from opposite sides of a core layer that provides a capacitor dielectric in the multilevel lamination structure 812. This device 800 has no conductive field plates above or below the respective conductive capacitor plates 841 and 842. In this example, however, the conductive capacitor plates 841 and 842 are coupled to other features by direct routing within the corresponding metal layers. The packaged electronic device 800 of FIG. 8 also includes bond wires 846. The package structure 820 has first and second sides 851 and 852, where the first conductive leads 824-831 are located along, and extend outward from, the first side 851, and the second conductive leads 832-839 are located along, and extend outward from, the second side 852.

A graph 900 in FIG. 9 shows stressed volume ($S_V$ in mm$^3$) as a function of applied electric field strength for the respective magnetic assemblies 710 and 810 of FIGS. 7 and 8, where the X-axis field strength is shown as a ratio α ($E/E_0$). A first curve 901 in FIG. 9 shows the stressed volume performance ($S_V$) of the magnetic assembly 710 with the field plates 743 and 744 and the vias 745 and 746, and a second curve 902 shows the stressed volume performance ($S_V$) of the magnetic assembly 810 of FIG. 8 without any conductive field plates. The curve 901 demonstrates lower stressed volume by the inclusion of the via connections of field plates 743 and 744 to the respective conductive capacitor plates 741 and 742 in the magnetic assembly 710.

Referring now to FIGS. 10-22, FIG. 10 shows a method 1000 of fabricating an electronic device, and FIGS. 11-22 show partial sectional end elevation views of the packaged electronic device 100 of FIG. 1 undergoing fabrication according to the method 1000. The method 1000 can also be implemented to fabricate other packaged electronic devices, for example, the device 700 of FIG. 7. The method 1000 includes fabricating the magnetic assembly 110 at 1001, 1002, 1004 and 1006, including fabricating the multilevel lamination structure 112 with the conductive field plates 143 and 144 at 1001. In certain implementations, the multilevel lamination structure 112 of the magnetic assembly 110, or the magnetic assembly 110 itself is fabricated and provided as an input to a separate fabrication method used to produce a packaged electronic device 100.

The illustrated lamination structure fabrication at 1001 constructs the example multilevel lamination structure 112 that includes the first and second patterned conductive features 109 and 111 having multiple turns to form the respective first and second windings extending in respective X-Y planes, the first and second conductive capacitor plates 141 and 142 spaced apart from opposite sides of the core layer 161 along a third direction Z and the first and second conductive field plates 143 and 144 described above, with the first conductive capacitor plate 141 positioned between the first conductive field plate 143 and the core layer 161 along the third direction Z, and the second conductive capacitor plate 142 positioned between the second conductive field plate 144 and the core layer 161 along the third direction Z.

FIGS. 11-20 show one implementation of the multilevel lamination structure at 1001, including formation of successive layers or levels in each of the top and bottom sides of the starting dielectric core layer 161, each including a dielectric material layer 162-165 and patterned conductive metal features (e.g., copper, aluminum or alloys thereof) labeled as the six metal layers M1-M6. The processing at 1001 also includes forming conductive features and conductive inter-level vias (not shown) to interconnect patterned conductive features of different layers to one another. The conductive features 109, 111, 141, 142, 143 and 144 in the illustrated example are formed in or on one or more of the six metal layers M1, M2, M3, M4, M5 and M6 on or between respective ones or pairs of the dielectric layers 162-165 and/or the core layer 161. In the illustrated orientation, the core layer 161 and the dielectric layers 162-165 extend in respective X-Y planes and are stacked along the third direction Z. The core layer 161 in one example provides an electrical isolation barrier between the first or primary circuit and the second or secondary circuit operating at an associated second voltage domain. The lamination structure 112 in one example is or includes build-up material formed by dry film lamination that begins as sheets that are pressed or otherwise installed onto a previous layer that may include patterned conductive features on a side thereof, where the attached build-up material sheet fills gaps between the existing patterned conductive features and provides a dielectric layer with a generally planar side for formation of patterned conductive features of a new metal layer, formation of conductive vias through the attached layer and attachment of a subsequent layer. In one example, the lamination structure 110 and the constituent buildup material sheets are or include an organic material.

Figure 11:
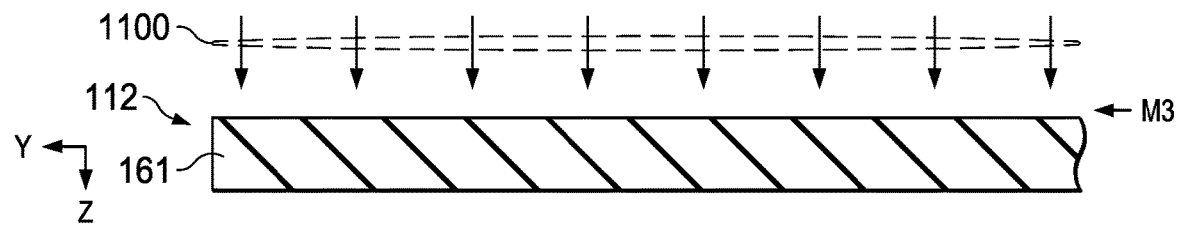
FIGS. 11-22 are partial sectional end elevation views of the packaged electronic device of FIG. 1 undergoing fabrication according to the method of FIG. 7.

In FIG. 11, a process 1100 is performed that positions the core layer 161 as a sheet or strip on a carrier, such as an adhesive tape (not shown) for concurrent processing of multiple areas that individually correspond to a prospective multilevel lamination structure 112 which are subsequently separated, for example, by saw cutting, laser cutting or other suitable process. The processing 1100 in one example includes forming one or more patterned conductive features (not shown) of the metal layer M3 on the bottom side of the core layer 161 and/or formation of one or more conductive vias (not shown) through the core layer 161.

Figure 12:
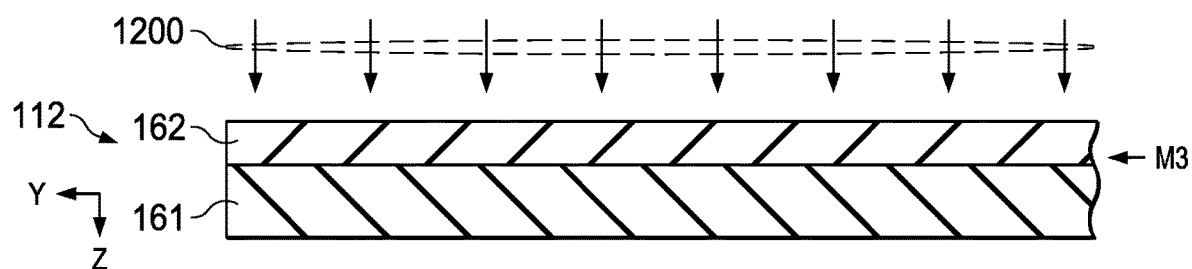
Figure 13:
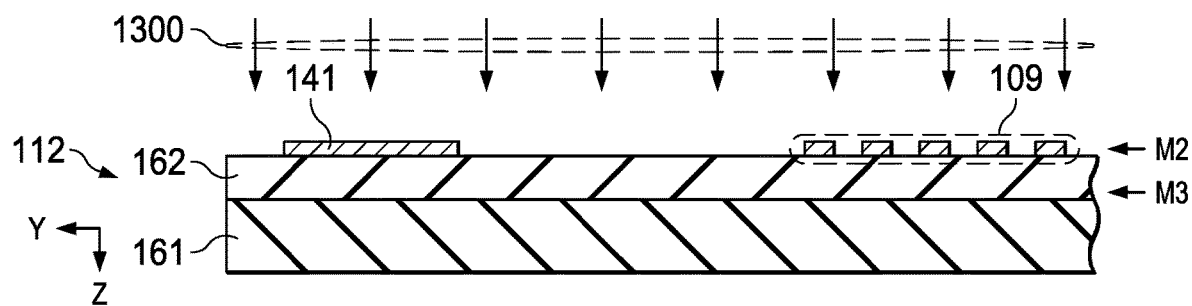
Figure 14:
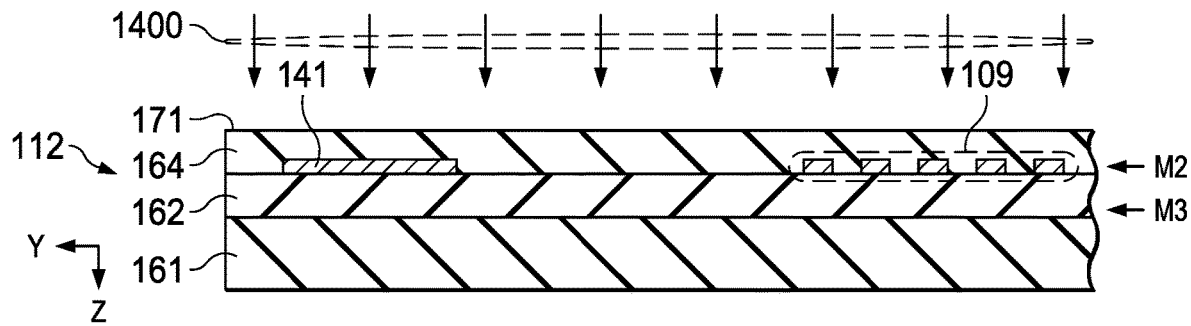
Figure 15:
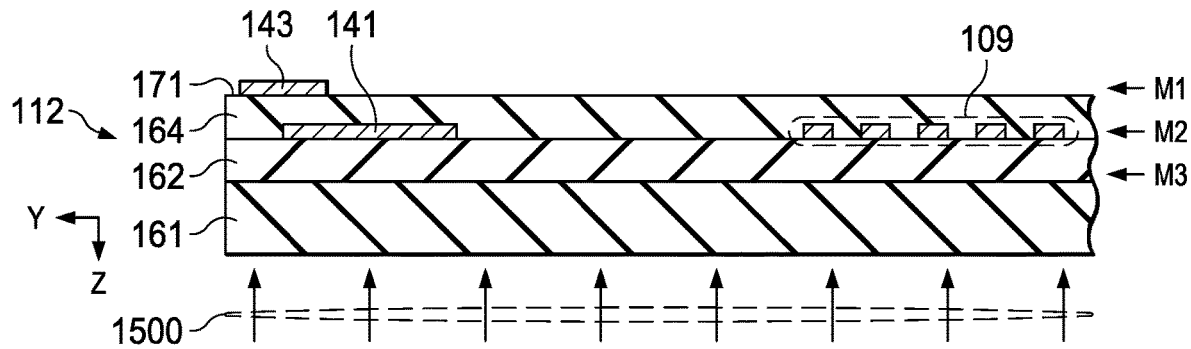

In FIG. 12, a first attachment process 1200 is performed that attaches the dielectric layer 162 to the bottom side of the core layer 161, for example, by dry film lamination. In FIG. 13, a metallization process 1300 is performed that forms the coil and capacitor plate patterned conductive features 109 and 141 of the metal layer M2 on the bottom side of the dielectric layer 162, for example, by blanket deposition and pattern etching. The metallization process 1300 and other metallization processes of the lamination structure fabrication include formation of any desired conductive via structures to extend through the previously attached dielectric layer. In FIG. 14, an attachment process 1400 is performed that attaches the dielectric layer 164 to the bottom side of the dielectric layer 162, covering and filling gaps between the patterned conductive features 109 and 141 of the metal layer M2. In FIG. 15, another metallization process 1500 is performed that forms patterned conductive features including the first conductive field plate 143 of the bottom metal layer M1.

Figure 16:
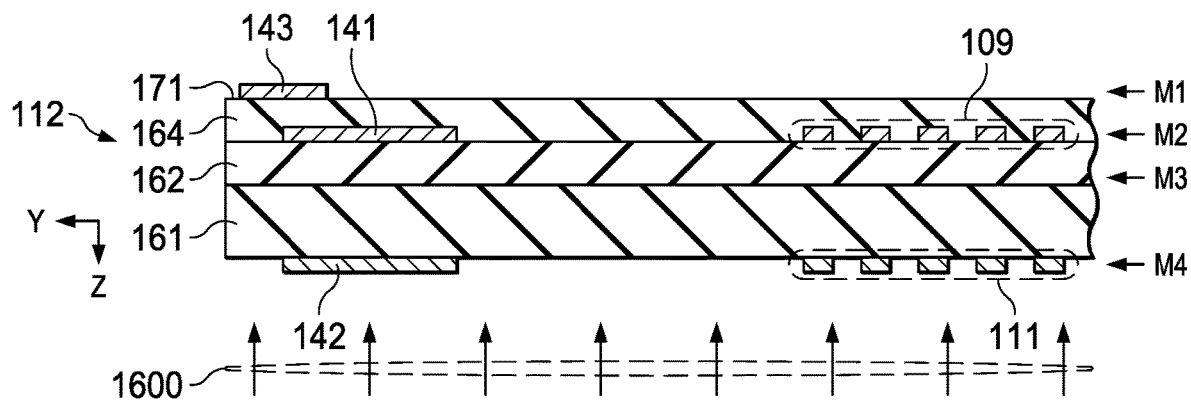
Figure 17:
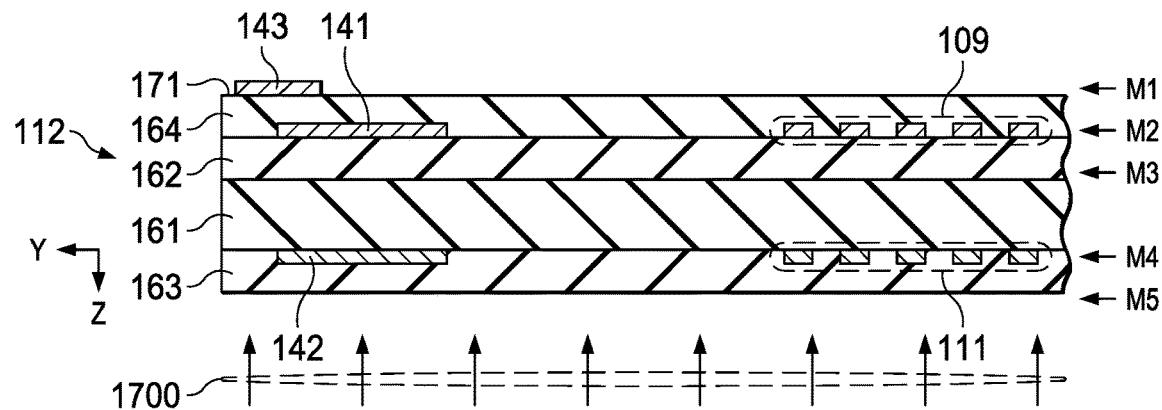
Figure 18:
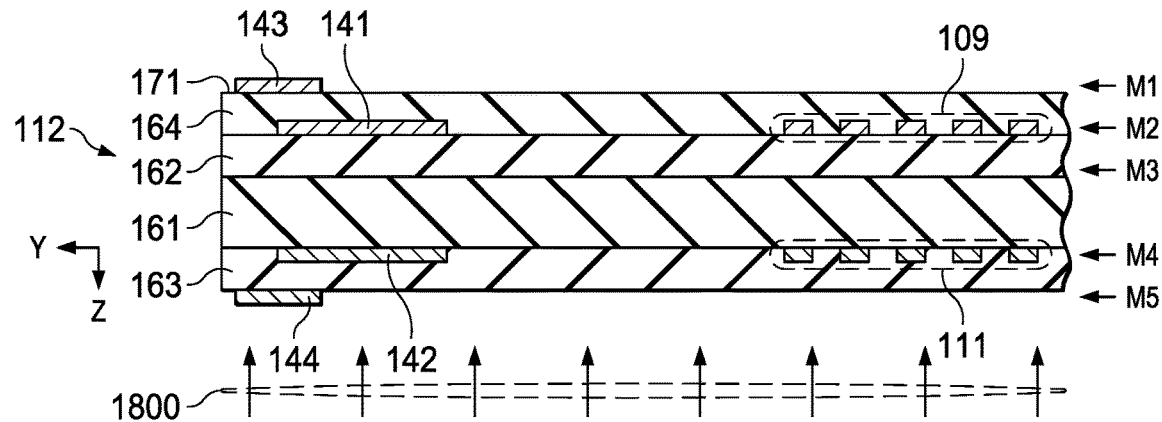
Figure 19:
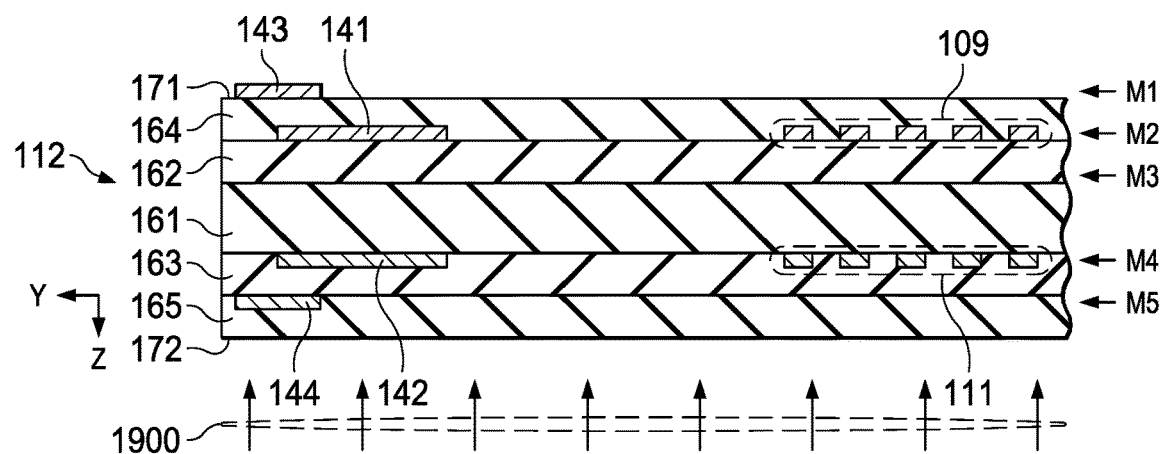

In FIG. 16, a metallization process 1600 is performed that forms the patterned conductive features 111 and 142 of the metal layer M4 on the top side of the core layer 161. In FIG. 17, an attachment process 1700 is performed that attaches the dielectric layer 163 to the top side of the core layer 161, covering and filling gaps between the patterned conductive features 111 and 142. In FIG. 18, a metallization process 1800 is performed that forms the patterned conductive field plate 144 and other patterned conductive features (not shown) of the metal layer M5 on the top side of the dielectric layer 163. In FIG. 19, another attachment process 1900 is performed that attaches the dielectric layer 165 to the top side of the previous dielectric layer 163, covering and filling gaps between the patterned conductive features (e.g., field plate 144) of the metal layer M5.

Figure 20:
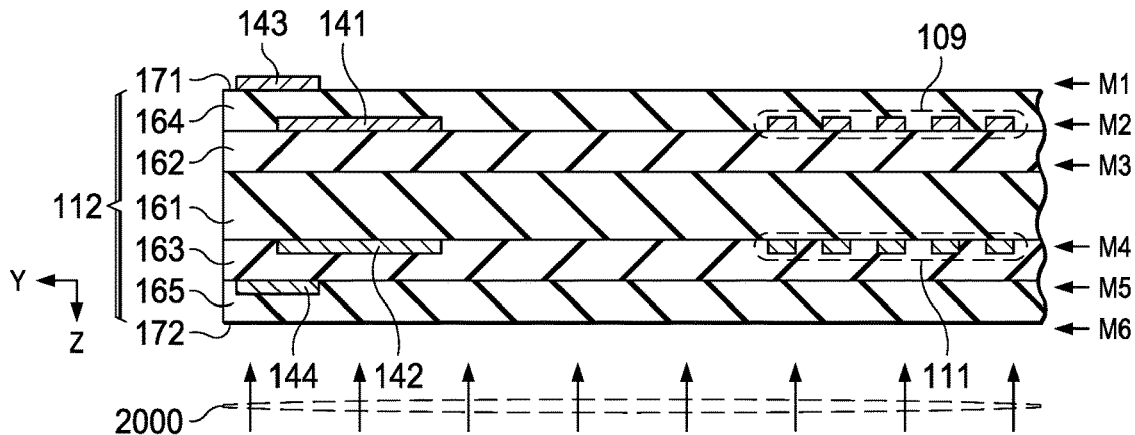

In one example, the multilayer lamination structure fabrication at 1001 includes formation of conductive metal features on the top and/or bottom side of the lamination structure 112 to allow bond wire connection to the transformer windings, the terminals or plates 141, 142 of the capacitor 140 and/4 the conductive field plates 143 and 144 in the finished packaged electronic device 100 (e.g., FIG. 1). In one example, the multilayer lamination structure fabrication at 1001 includes curing processing. FIG. 20 shows one example, in which a thermal process 2000 is performed that cures the assembled multilayer lamination structure 112.

Figure 10:
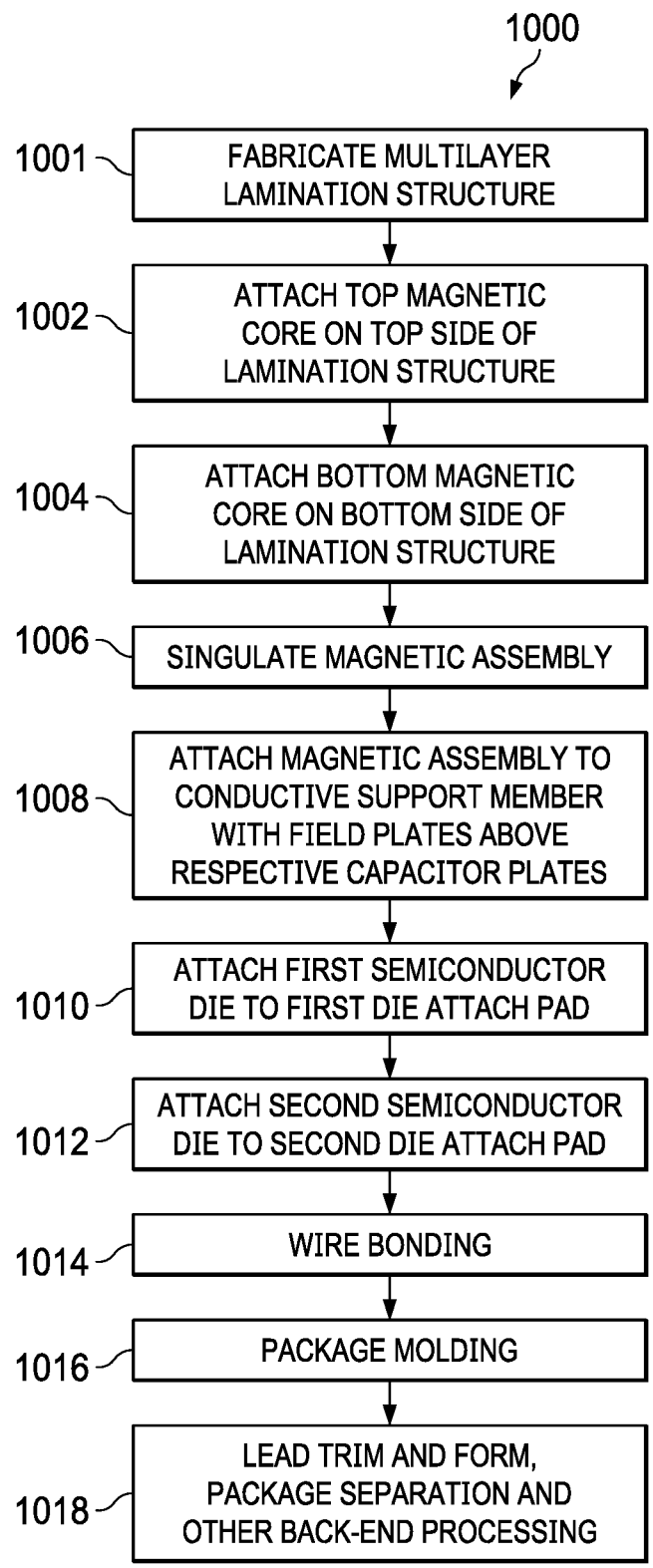
FIG. 10 is 7 is a flow diagram of a method of fabricating an electronic device.
Figure 21:
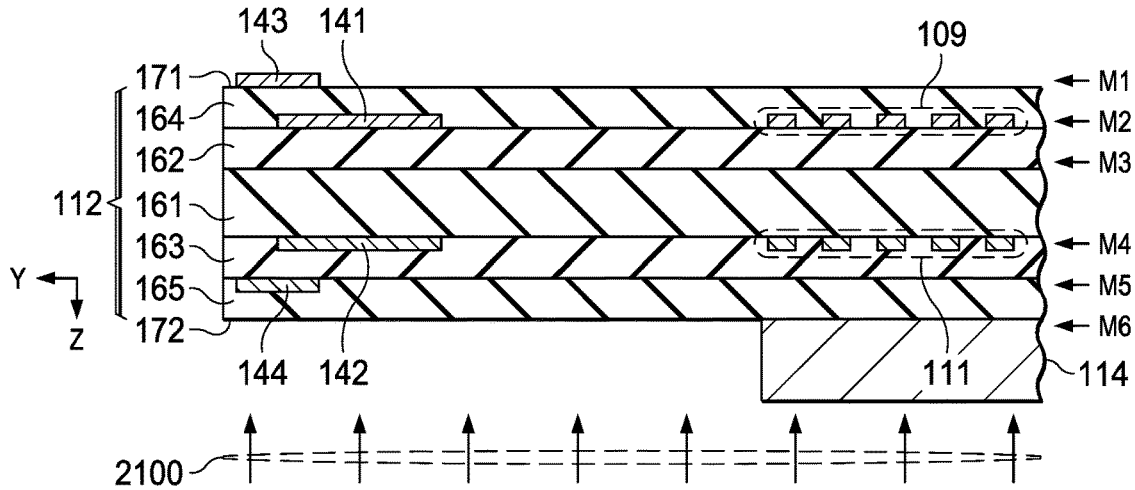

The method 1000 continues at 1002 in FIG. 10 with attaching the top magnetic core structure to the top side of the multilayer lamination structure 112. In FIG. 21, an attachment process 2100 is performed that attaches the first magnetic core structure 114 to a portion of the top side of the dielectric layer 165, for example, using epoxy or another suitable adhesive (not shown). The magnetic core structure 114 in one example is a magnetic sheet structure, although not required of all possible implementations. The attachment process 2100 can include deposition of an epoxy or other adhesive onto the bottom surface of the multilevel lamination structure 112 and/or onto the surface of the core structure 114. The adhesive in one example is printed magnetic ink epoxy, although non-magnetic adhesives can be used in other examples. The attachment process 1200 also includes bringing the core structure 114 into contact with a portion of the top side of the multilevel lamination structure 112 and/or into contact with the epoxy formed thereon. The attachment process 1200 in one example also includes any necessary curing steps (e.g., thermal, optical, ultraviolet (UV), etc.).

Figure 22:
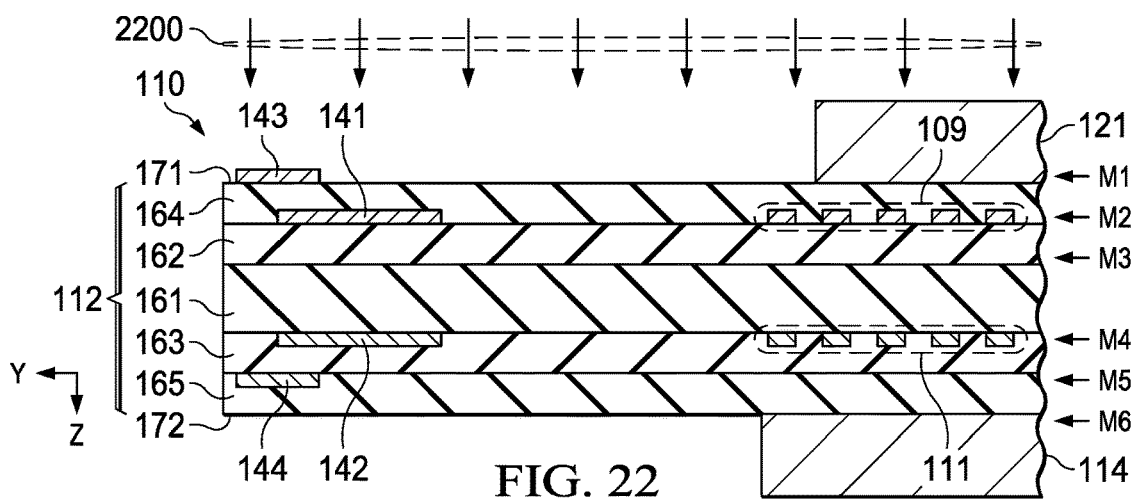

At 1004 in FIG. 10, the method 1000 continues with attachment of the second magnetic core structure 121 to the opposite bottom side of the multilayer lamination structure 112. In FIG. 22, another attachment process 2200 is performed that attaches the second magnetic core structure 121 to a portion of the bottom side of the dielectric layer 164, for example, using epoxy or other adhesive (not shown) in an attachment process and like the process 2100 used to attach the first magnetic core structure 114 as described above. In other examples, one or both magnetic core structures 121 and 114 can be omitted, with the remaining core structure providing magnetic coupling for the transformer of the device 100.

The method 1000 in one example further includes separating (e.g., singulating) the magnetic assembly at 1006. In the illustrated implementation, the magnetic assembly process is used to concurrently fabricate multiple laminated magnetic assemblies, such as using a single large multilevel lamination structure 112, and attachment of one or more core structures 114, 121 to opposite sides thereof. At 1006 in one example, the lamination structure 112 is diced or cut to singulate or separate individual laminated magnetic assemblies 110 (not shown) from the initial unitary structure, for example, using a saw blade, etching, laser cutting, etc.

At 1008, the magnetic assembly 110 is attached to the support structure 122 of a starting lead frame. In one example, the starting lead frame is a panel with an array of frozen columns of prospective device areas processed concurrently, followed by subsequent device separation after package molding. In one example, a lead frame structure is provided that includes the support structure 122, conductive leads (e.g., 124-139 in FIG. 1) and conductive die attach pads 104 and 108. In one implementation, the lead frame structure is provided on a tacky tape or other adhesive carrier, with the various constituent structures assembled in a predetermined relative arrangement to facilitate subsequent assembly steps in the method 1000. Any suitable attachment process can be used, such as application of adhesive, joining the components, and any necessary curing. In another example, conductive features of the multilevel lamination structure 112 can be soldered to the support structure 122 at 1008.

The process 1000 continues at 1010 and 1012 in FIG. 10 with attaching semiconductor dies to corresponding die attach pads, for example, using adhesive or soldering. The attachment process and 1000 ton attaches the first semiconductor die 102 to the first die attach pad 104 (e.g., where the die attach pad 104 is one continuous conductive structure that includes the lead 125) in the orientation shown in FIG. 1 above. At 1012, the processing also attaches the second semiconductor die 106 to the corresponding second die attach pad 108 (e.g., one continuous conductive structure that also includes the lead 138) as shown in FIG. 1.

The method 1000 also includes wire bonding or other electrical connection processing at 1014. FIG. 1 shows one example in which wire bond connections 146 are formed between the semiconductor dies 102, 106 and one or more conductive leads and/or exposed conductive features of the magnetic assembly 110 to form first and second circuits. In another example, different electrical connections are formed to create the first circuit, such as flip-chip processing to interconnect solder balls, conductive pillars, bond pads, etc. of the structures together in first and second electrical circuits. In certain examples, the wire bonding or other interconnection processing at 1014 can be performed using supporting structures to provide mechanical structural support for one or more features of the magnetic assembly 110 during bond wire attachment. In one example, one or both magnetic core structures 114 and 121 can be supported with a custom bond wire clamping tool (not shown) during bond wire soldering operations. In one example, the bond wire clamping tool can include a cavity to support the laminate bond pad area that extends beyond the portions supported by the magnetic core structure or structures 114 and/01 21.

The method 1000 continues at 1016 with forming the final package structure 120. In one example, the packaging at 1016 includes performing a molding process (not shown) that forms the package structure 120 to enclose the dies 102 and 106, the conductive die attach pads 104 and 108, the support structure 122, the magnetic assembly 110, the electrical connections (e.g., the bond wires 146) and portions of the conductive leads 124-139. At 1018 in FIG. 10, lead trimming and forming operations are performed along with package separation and other back and processing to provide multiple finished packaged electronic device products, such as the device 100 shown in FIG. 1 above.

Figure 23:
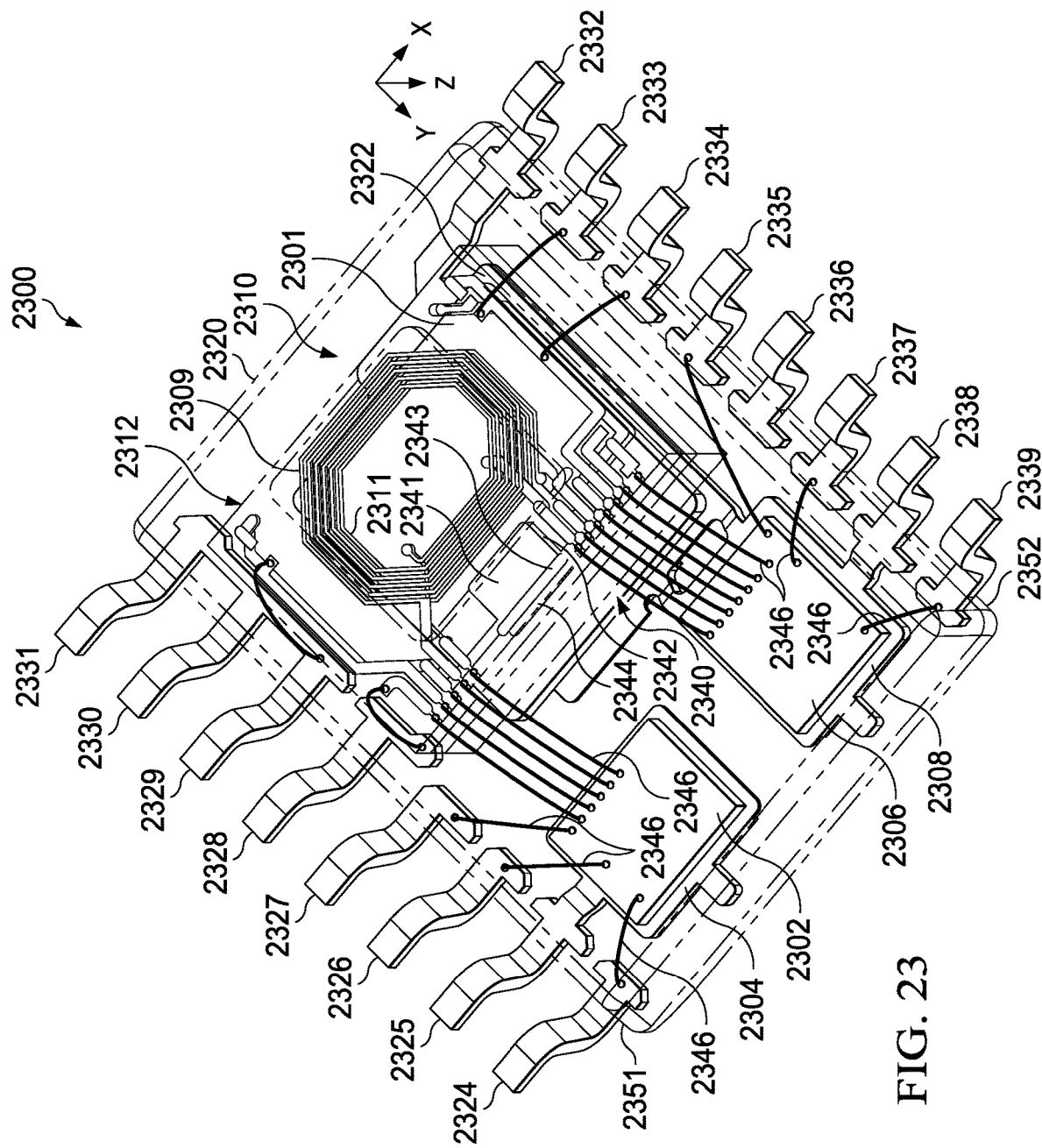
FIG. 23 is a bottom perspective view of a packaged electronic device that includes a multilayer metallization structure with a magnetic assembly having coil windings, capacitor plates and conductive field plates.
Figure 23A:
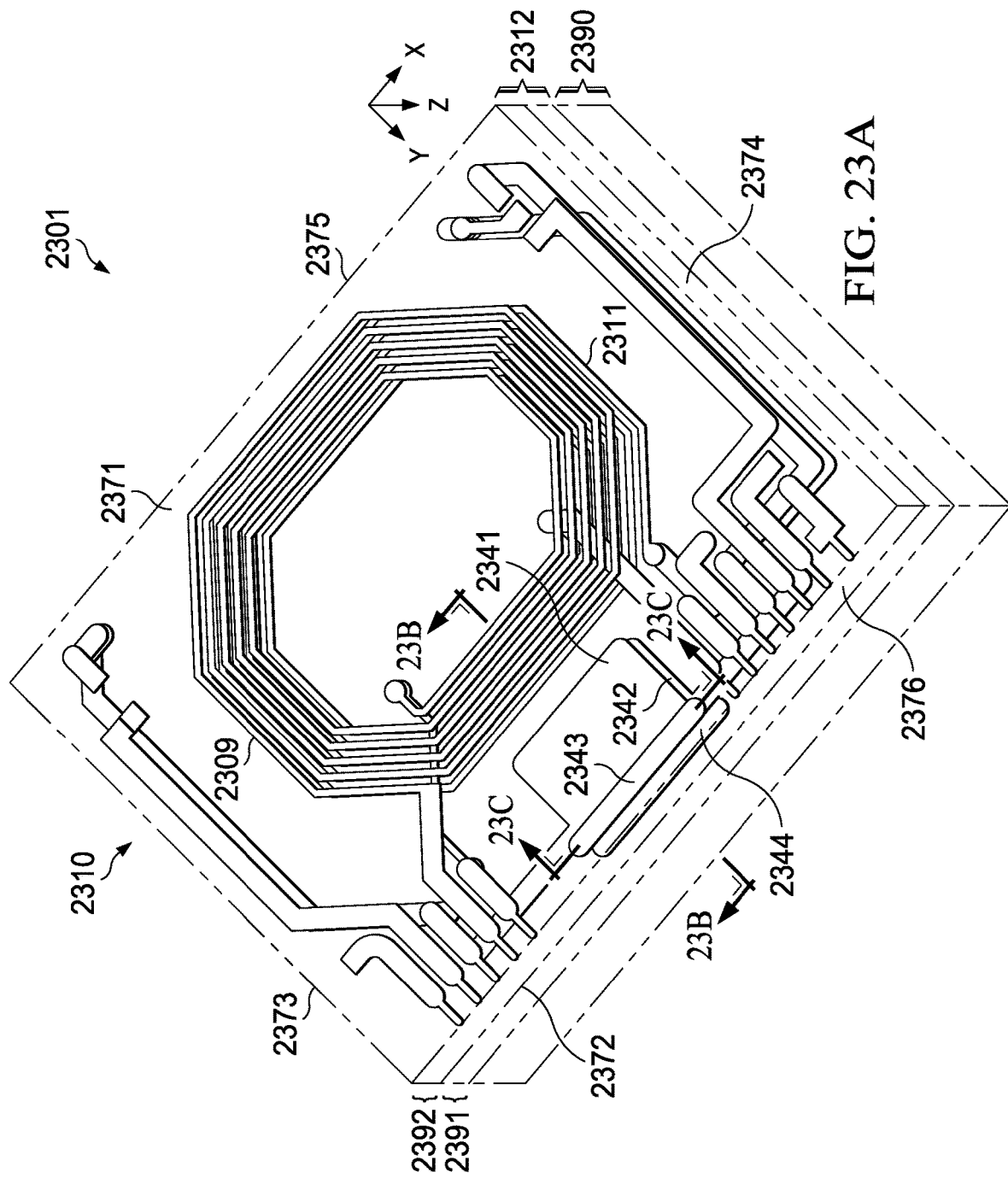
FIG. 23A is a bottom perspective view of the magnetic assembly of FIG. 23.
Figure 23B:
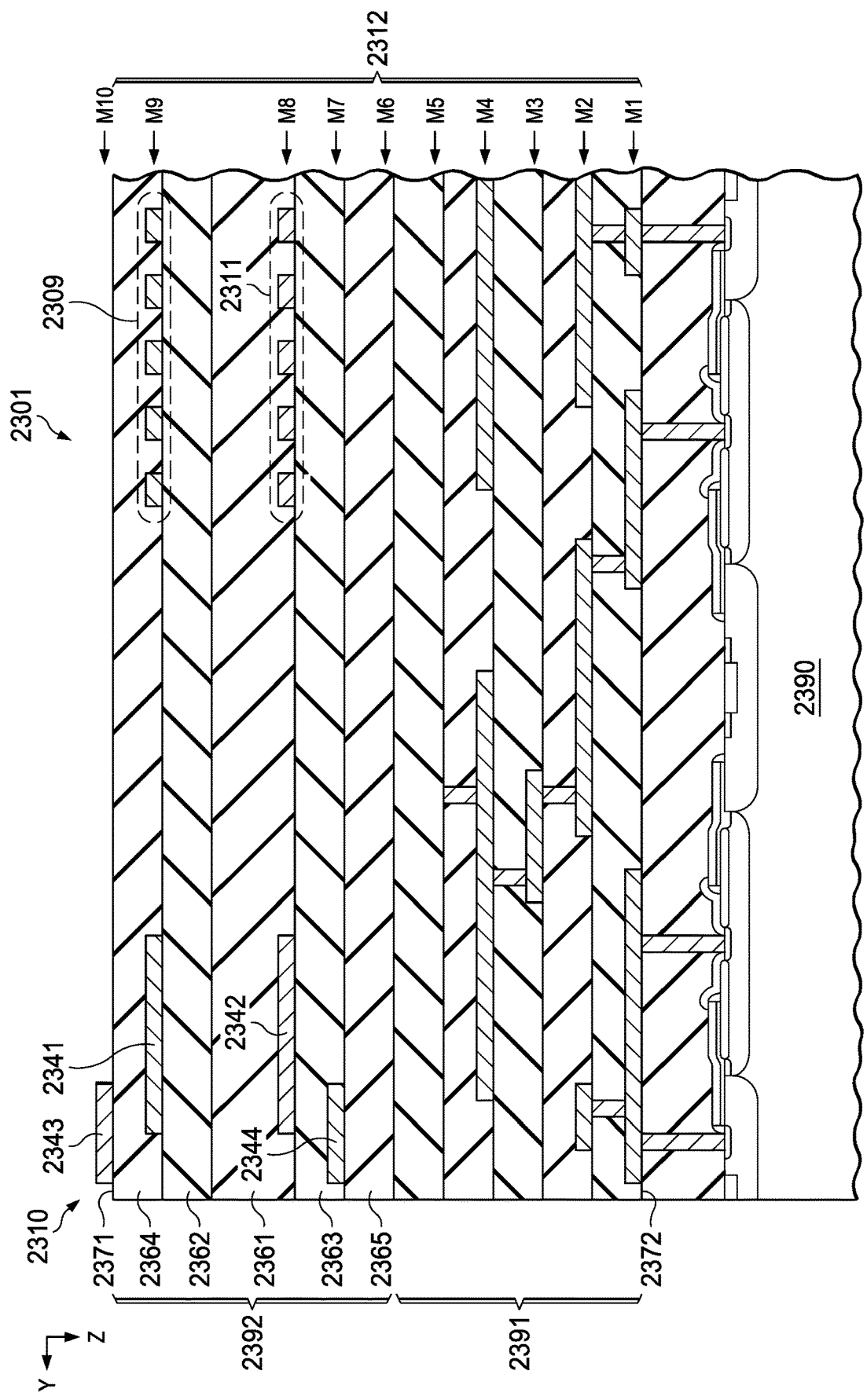
FIG. 23B is a partial sectional end view of the magnetic assembly taken along line 23B-23B of FIG. 23A.
Figure 23C:
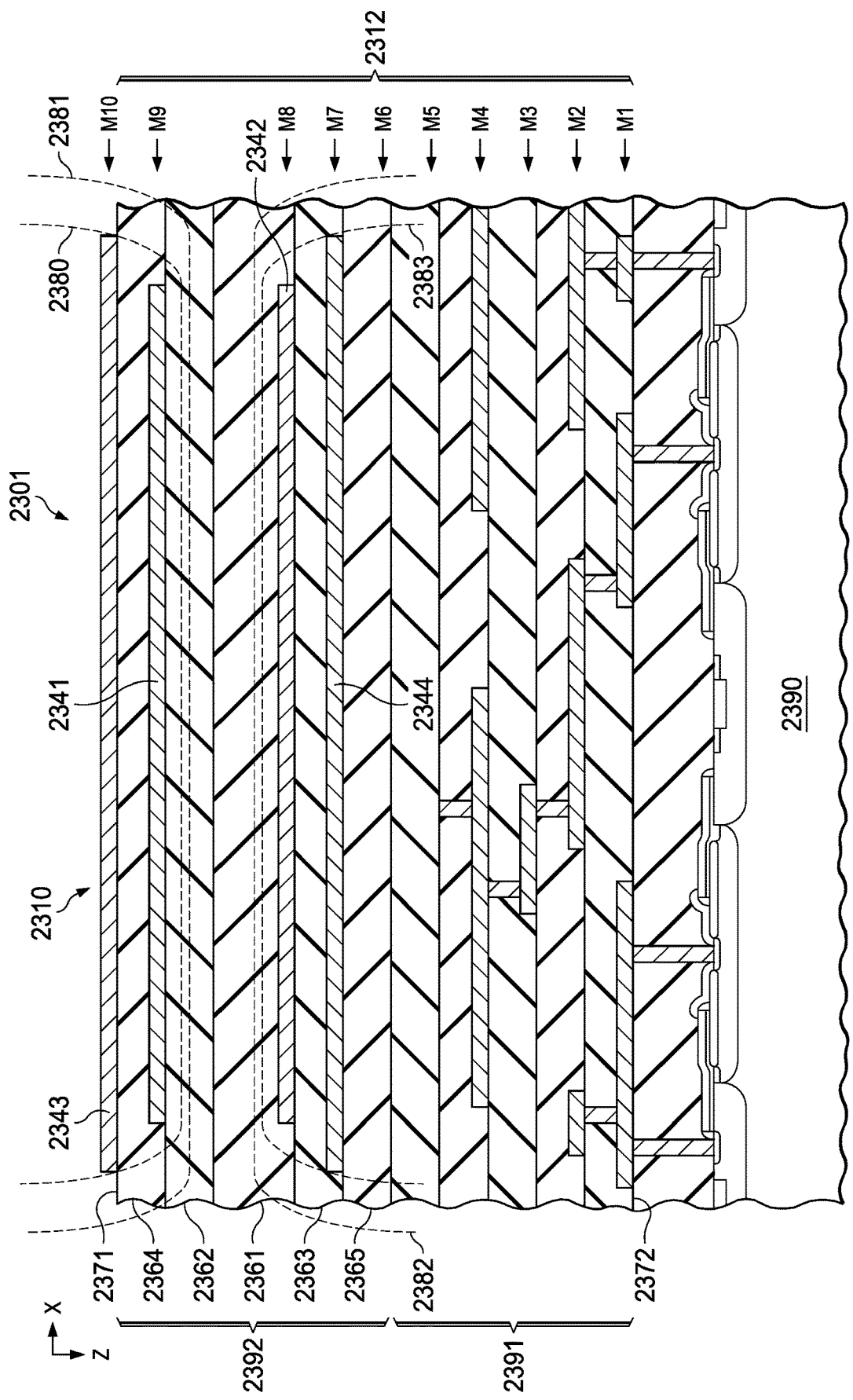
FIG. 23C is another partial sectional end view of the magnetic assembly taken along line 23C-23C of FIG. 23A.

Referring to FIGS. 23-23C, FIG. 23 shows a bottom perspective view of a packaged electronic device 2300 with magnetic assembly in a multi-level metallization structure of a semiconductor die. The magnetic assembly in this example includes field plates that help mitigate high electric fields and undesired stress within an isolation barrier without increasing the size of the integrated electronic device. FIG. 23A shows a bottom perspective view of the magnetic assembly of FIG. 23, FIG. 23B is a partial sectional end view of the magnetic assembly taken along line 23B-23B of FIG. 23A. FIG. 23C is a partial sectional end view of the magnetic assembly taken along line 23C-23C of FIG. 23A. The integrated field plates facilitate small form factor integrated electronic devices with high voltage isolation for automotive, industrial or other applications in which voltage isolation and small device size are important. The field plate solution can be used in products having symmetric or asymmetric magnetic assembly positioning and provides a scalable solution to accommodate designs with differing electric field levels, efficiency and/or EMI performance specifications. The field plate solution can be implemented in a magnetic assembly mounted with a semiconductor die on a shared die attach pad or the magnetic assembly can be separately mounted on a conductive support structure spaced apart from integrated semiconductor dies and associated conductive die attach pads as in the example of FIG. 23. Field plates can be provided in one or more layers or levels of the multilevel metallization structure and operate to reduce the overall internal field strength within desired design specifications to mitigate undesired stress within the semiconductor die barrier and premature device failure for integrated isolated power products in one example.

The example electronic device 2300 has a small outline integrated circuit (SOIC) package type with gull wing leads on opposite first and second sides spaced from one another along a first direction labelled "X" in the drawings. Other packaged electronic devices can be provided in different implementations, including conductive features that can be soldered to another structure or structures for electrical interconnections, such as so called leadless package types (e.g., flat no-leads packages such as quad-flat no-leads (QFN), dual-flat no-leads (DFN), micro lead frame (MLF) and small-outline no leads (SON) types with planar conductive leads such as perimeter lands on the package bottom and/or side that provide electrical connections to a printed circuit board (PCB). In other examples, the device 2300 includes a ball grid array (BGA) package or a land grid array (LGA) type, such as a mold array process ball grid array (MAPBGA) or an over-molded BGA (e.g., plastic BGA or PBGA).

The electronic device 2300 of FIGS. 23-23C provides electrical interconnections for first and second electrical circuits, some or all of which are implemented using bond wires. In other implementations, different forms of interconnection types can be used, including substrate-based interconnections (BGA, LGA, etc.), and which a substrate includes electrical interconnections and signal routing structures (e.g., copper or aluminum traces on one or more layers or levels) alone or in combination with bond wire electrical connections. As shown in FIG. 23, the example device 2300 includes conductive features (e.g., conductive die attach pads or supports) for mounting and supporting first and second semiconductor dies, and a third semiconductor die 2301 that includes a magnetic assembly in a multilevel metallization structure. The third semiconductor die 2301 in one example includes one or more components formed on or in the semiconductor die. In another example, the third semiconductor die 2301 does not include any components on or in the semiconductor die, and only includes the magnetic circuit components of the metallization structure. The die attach pads and device leads can include any suitable conductive structures, such as copper, aluminum, etc. The example device 2300 in FIG. 23 includes a first semiconductor die 2302 attached to a first conductive die attach pad 2304 of a starting lead frame assembly. The device 2300 also includes a second semiconductor die 2306 attached to a second conductive die attach pad 2308.

The electronic device 2300 includes a first circuit associated with a first voltage domain (e.g., a high voltage primary circuit of an integrated power device) as well as a second circuit associated with a second voltage domain (e.g., an isolated lower voltage secondary circuit). The third semiconductor die 2301 includes a first patterned conductive feature 2309 with multiple turns in a magnetic assembly 2310 to form a first winding (e.g., a primary winding of an isolation transformer of the first circuit). The second circuit in this example includes a secondary winding formed by a second patterned conductive feature 2311 (also referred to as a second winding) of the magnetic assembly 2310. The magnetic assembly 2310 includes a multilevel metallization structure 2312 having the first and second patterned conductive features 2309 and 2311 as well as conductive capacitor plates and field plates as described further below. The first and second patterned conductive features 2309 and 2311 each have multiple turns to form respective first and second windings that extend in respective planes of orthogonal first and second directions X and Y in the position illustrated in the figures. The electronic device 2300 can also include one or more core structures made of ferrous material (not shown), for example, attached to a top side of the third semiconductor die 2301, to facilitate forming a magnetic circuit in combination with the patterned conductive features 2309 and 2311 of the third semiconductor die 2301.

The packaged electronic device 2300 also includes a package structure 2320 that encloses the conductive die attach pads 2304 and 2308, the semiconductor dies 2301, 2302 and 2306, the magnetic assembly 2310, and portions of conductive leads of the device 2300. In one example, the package structure 2320 is or includes a molded material, such as plastic. In another example, the package structure 2320 is or includes a ceramic material. The third semiconductor die 2301 and the included magnetic assembly 2310 is attached to a support structure 2322 that is integral to the second conductive die attach pad 2308. In another implementation, the third semiconductor die 2301 is mounted to a support structure (not shown) that is separated and spaced apart from the first and second die attach pads 2304 and 2308. The packaged electronic device 2300 has conductive gull-wing shaped leads 2324-2331 along one side of the device 2300, as well as conductive gull-wing shaped leads 2332-2339 along an opposite side. The magnetic assembly 2310 also includes a capacitor 2340 having a first conductive capacitor plate 2341 and a second conductive capacitor plate 2342 spaced apart from opposite sides of a core layer that provides a capacitor dielectric in the multilevel metallization structure 2312.

The multilevel metallization structure 2312 also includes first and second conductive field plates 2343 and 2344 that help mitigate high electric fields and undesired stress within the isolation barrier without increasing the size of the integrated electronic device. The packaged electronic device also includes bond wires 2346. A first set of the bond wires 2346 interconnects certain of the leads 2324-2331, the primary winding of the magnetic assembly 2310 and the first semiconductor die 2302 and the third semiconductor die 2301 in a first circuit. A second set of the bond wires 2346 interconnects certain of the leads 2332-2339, the secondary winding of the magnetic assembly 2310, the second semiconductor die 2306 and the third semiconductor die 2301 in a second circuit.

As best shown in FIG. 23, the first conductive die attach pad 2304 is directly coupled to a single first lead 2325. In other examples, the die attach pad 2304 is directly coupled to multiple conductive first leads. In the example device 2300, the die attach pad 2304 and the lead 2325 are a single continuous metal structure, such as copper or aluminum. The second conductive die attach pad 2308 is directly coupled to a single lead 2338, and the connected support structure 2322 is directly connected to a single lead 2332. In other examples, the second die attach pad 2308 and/or the support structure 2322 is/are directly coupled to multiple conductive leads. In the example device 2300, the second die attach pad 2308, the support structure 2322, and the leads 2332 and 2338 are a single continuous metal structure, such as copper or aluminum. The package structure 2320 encloses the die attach pads 2304 and 2308, and the associated support structure 2322. Also, the package structure 2320 encloses inner portions of the conductive leads 2324-2339. The conductive leads 2324-2339 in one example are so-called gull wing leads that extend downward and outward from the package structure 2320. Different types and shapes of conductive leads can be used in other examples (e.g., J leads).

As best shown in FIG. 23, the package structure 2320 has respective first and second sides 2351 and 2352 spaced apart from one another along the first direction (e.g., the X direction). The first conductive leads 2324-2331 are located along, and extend outward from, the first side 2351 of the package structure 2320. The second conductive leads 2332-2339 are located along, and extend outward from, the second side 2352 of the package structure 2320.

As shown in the sectional views of FIGS. 23B and 23C, the magnetic assembly 2310 includes the multilevel metallization structure 2312 having a core layer 2361 and dielectric metallization structure layers 2362, 2363, 2364 and 2365. The core layer 2361 and the dielectric layers 2362-2365 are or include electrically insulating dielectric material, such as silicon dioxide ($SiO_2$). The example multilevel metallization structure 2312 includes metal layers indicated as M1, M2, M3, M4, M5, M6, M7, M8, M9 and M10 in FIGS. 23B and 23C. The layers M1-M10 individually include a dielectric layer and some or all include patterned conductive features formed by suitable single or dual damascene processes or other processes used in metallization during wafer processing. The thickness and material of the core layer 2361 provides a withstanding voltage according to a desired voltage separation between the first and second circuits for a given design, and the dielectric material and thickness provide a dielectric between the capacitor plates 2341 and 2342 for the capacitor 2340 of the multilevel metallization structure 2312.

The conductive features 2309, 2311, 2341, 2342, 2343 and 2344 are formed in one or more of six metal layers M1, M2, M3, M4, M5 and M6 on or between respective ones or pairs of the dielectric layers 2362-2365 and/or the core layer 2361. The core layer 2361 and the dielectric layers 2362-2365 extend in respective planes of the first and second directions X, Y and are stacked along the third direction Z as best shown in the sectional view of FIGS. 23B and 23C. The core layer 2361 in one example provides an electrical isolation barrier between the first or primary circuit and an associated first voltage domain, and the second or secondary circuit operating at an associated second voltage domain. The multilevel metallization structure 2312 also has one or more conductive vias providing electrical interconnection for routing signals between two or more of the six metal layers M1-M6.

As shown in FIGS. 23B and 23C, the multilevel metallization structure 2312 has a Z-direction stack of metal levels M1-M10 formed on or in or between individual ones of the core layer 2361 and the dielectric layers 2362-2365. The first patterned conductive feature 2309 includes multiple turns in the metal layer M10 to form the first winding, and the second patterned conductive feature 2311 has multiple turns in the metal layer M8 as shown in FIG. 23B. The first and second windings in this example are on opposite sides of the core layer 2361. In one example, the first patterned conductive feature 2309 and the first conductive capacitor plate 2341 are formed in the same metal layer M10 as each other, and the second patterned conductive feature 2311 and the second conductive capacitor plate 2342 are formed in the same metal layer M8 as each other. In this example, the first patterned conductive feature 2309 is formed in the second metal layer M8 above the core level 2361 in layer M8, and the core layer 2361 is positioned between the first and second patterned conductive features 2309 and 2311 along the third direction Z. In other examples, more or fewer dielectric layers 2361-2365 can be provided, and more or fewer metal layers can be used. The capacitor plates 2341 and 2342 are also on opposite sides of the core layer 2361 and the capacitor 2340 has respective terminals coupled to the first and second circuits on either side of the electrical isolation barrier provided by the core layer 2361.

As further shown in FIG. 23A, the multilevel metallization structure 2312 has a first or bottom side 2371 on a top side of a processed semiconductor die 2390, a second or top side 2372 spaced apart from one another along the third direction Z, lateral sides 2373 and 2374 spaced apart from one another along the first direction X, and lateral sides 2375 and 2376 spaced apart from one another along the second direction Y. FIG. 23C further shows example electric field lines 2380 and 2381 in the multilevel metallization structure 2312 during powered operation of the first and second circuits.

The semiconductor die 2390 in one example is or includes silicon or other semiconductor material, and may include one or more electronic components or circuits, such as transistors, resistors, capacitors, etc. The first five metallization layers M1-M5 in this example are used for signal routing and interconnection of features and/or components of the semiconductor die 2390 in a first (e.g., lower) portion 2391 of the metallization structure 2312. The remaining metallization layers M6-M10 include conductive features of the first and second magnetic circuits that form a second (e.g., upper) portion 2392 of the multilevel metallization structure 2312. The first conductive capacitor plate 2341 is positioned between the first conductive field plate 2343 and the core layer 2361 along the third direction Z, and the second conductive capacitor plate 2342 is positioned between the second conductive field plate 2344 and the core layer 2361 along the third direction Z. Also, as best seen in FIGS. 23A-23C, the first conductive field plate 2343 in this example has a lateral extent in a first field plate plane of the first and second directions X and Y that extends beyond a lateral extent of the first conductive capacitor plate 2341. Also, the second conductive field plate 2344 has a lateral extent in a second field plate plane of the first and second directions X and Y that extends beyond a lateral extent of the second conductive capacitor plate 2342. In this example, the first conductive field plate 2343 extends laterally along the positive Y direction in FIG. 23B beyond the lateral extent of the first conductive capacitor plate 2341, and the second conductive field plate 2344 extends laterally along the positive Y direction beyond the lateral extent of the second conductive capacitor plate 2342.

The first conductive field plate 2343 in this example also extends laterally along the positive and negative X direction in FIG. 23C beyond the X-direction lateral extent of the first conductive capacitor plate 2341, and the same is true of the second conductive field plate 2344 and the second conductive capacitor plate 2342. As further shown in FIG. 23C, the relative positioning of the conductive field plates 2343 and 2344, the conductive capacitor plates 2341 and 2342 and the windings mitigates excessive electric field strength in the core layer 2361 and the other layers 2362-2365 of the multilevel metallization structure 2312 to prevent or inhibit stress and/or premature damage or degradation of the voltage withstand capability of the packaged electronic device 2300 during operation. For example, the voltage of the first patterned conductive feature 2309 and metal structures above the core layer 2361 can be much higher than the voltage of the second patterned conductive feature 2314 and other metal structures below the isolation boundary of the core layer 2361. FIG. 23C shows example electric field lines 2380, 2381, 2382 and 2383 that extend partially in the core layer 2361.

In one implementation, the capacitor 2340 is connected to one or both of the first and second circuits, for example with the first conductive capacitor plate 2341 coupled to a conductive feature of the first semiconductor die 2302 or other node of the first (e.g., primary) circuit, and the second conductive capacitor plate 2342 coupled to a conductive feature of the second semiconductor die 2306 or other node of the second (e.g., secondary) circuit. In one implementation, one or both the conductive field plates 2343 and/or 2344 is/are electrically floating. In another implementation, one or both conductive field plates 2343 and/or 2344 is/are coupled to a reference voltage node or a node of the first or second circuits. In one example, the first conductive field plate 2343 is coupled to a circuit node of the first circuit and the second conductive field plate 2344 is coupled to a circuit node of the second circuit. The conductive field plates 2343 and 2344 operate as electric field grading plates over high field generating layers such as the respective capacitor plates to lower fields in the isolation barrier.

In another example, a metallization structure of a semiconductor die includes a multilevel metallization structure with a magnetic assembly having coil windings, capacitor plates and conductive field plates with via connections, such as described above in connection with FIGS. 7-7C.

The described examples provide electronic devices and fabrication methods which can be employed to mitigate high electric fields in the laminate dielectric barrier using one or more conductive field plates, with or without via connections to other conductive structures within the multilayer lamination structure 112. The disclosed apparatus and techniques facilitate operation without device degradation or damage while allowing operation at potentially high voltage differences between first and second circuits within the packaged electronic devices 100, 700, without increasing the size of the magnetic assembly 100, and while mitigating voltage breakdown and reducing the stressed volume of the layers of the lamination structure 112.

Modifications are possible in the described examples, and other implementations are possible, within the scope of the claims.

What is claimed is:

1. A packaged electronic device, comprising:
a package structure; and
a magnetic assembly in the package structure, the magnetic assembly including a multilevel lamination or metallization structure having a core layer, dielectric layers and conductive features formed in metal layers on or between respective ones or pairs of the dielectric layers, the core layer and the dielectric layers extending in respective planes of orthogonal first and second directions and stacked along a third direction that is orthogonal to the first and second directions, the conductive features including:
first and second patterned conductive features, the first patterned conductive feature having multiple turns to form a first winding, the second patterned conductive feature having multiple turns to form a second winding, the core layer positioned between the first and second patterned conductive features along the third direction,
first and second conductive capacitor plates, the core layer positioned between the first and second conductive capacitor plates along the third direction, and
first and second conductive field plates, the first conductive capacitor plate positioned between the first conductive field plate and the core layer along the third direction, and the second conductive capacitor plate positioned between the second conductive field plate and the core layer along the third direction.

2. The packaged electronic device of claim 1, wherein:
the first patterned conductive feature and the first conductive capacitor plate are formed in the same metal layer as each other; and
the second patterned conductive feature and the second conductive capacitor plate are formed in the same metal layer as each other.

3. The packaged electronic device of claim 2, wherein the magnetic assembly includes a first magnetic core structure attached to a first side of the lamination or metallization structure, and a second magnetic core structure attached to a second side of the lamination or metallization structure.

4. The packaged electronic device of claim 3, wherein:
the first conductive field plate has a lateral extent in a first field plate plane of the first and second directions that extends beyond a lateral extent of the first conductive capacitor plate; and
the second conductive field plate has a lateral extent in a second field plate plane of the first and second directions that extends beyond a lateral extent of the second conductive capacitor plate.

5. The packaged electronic device of claim 2, wherein:
the first conductive field plate has a lateral extent in a first field plate plane of the first and second directions that extends beyond a lateral extent of the first conductive capacitor plate; and
the second conductive field plate has a lateral extent in a second field plate plane of the first and second directions that extends beyond a lateral extent of the second conductive capacitor plate.

6. The packaged electronic device of claim 1, wherein the magnetic assembly includes a first magnetic core structure attached to a first side of the lamination or metallization structure, and a second magnetic core structure attached to a second side of the lamination or metallization structure.

7. The packaged electronic device of claim 6, wherein:
the first conductive field plate has a lateral extent in a first field plate plane of the first and second directions that extends beyond a lateral extent of the first conductive capacitor plate; and
the second conductive field plate has a lateral extent in a second field plate plane of the first and second directions that extends beyond a lateral extent of the second conductive capacitor plate.

8. The packaged electronic device of claim 1, wherein:
the first conductive field plate has a lateral extent in a first field plate plane of the first and second directions that extends beyond a lateral extent of the first conductive capacitor plate; and
the second conductive field plate has a lateral extent in a second field plate plane of the first and second directions that extends beyond a lateral extent of the second conductive capacitor plate.

9. The packaged electronic device of claim 1, further comprising:
first conductive leads extending outward from a first side of the package structure;
second conductive leads extending outward from a second side of the package structure;
a first semiconductor die attached to a first die attach pad in the package structure;
a second semiconductor die attached to a second die attach pad in the package structure;
a first set of electrical connections that couple the first semiconductor die, the first patterned conductive feature, and at least one of the first conductive leads in a first circuit; and
a second set of electrical connections that couple the second semiconductor die, the second patterned conductive feature, the conductive guard trace, and at least one of the second conductive leads in a second circuit isolated from the first circuit.

10. The packaged electronic device of claim 1, wherein the magnetic assembly includes:
a first conductive via coupled between the first conductive capacitor plate and the first conductive field plate; and
a second conductive via coupled between the second conductive capacitor plate and the second conductive field plate.

11. A magnetic assembly, comprising:
a multilevel lamination or metallization structure having a core layer, dielectric layers and conductive features formed in metal layers on or between respective ones or pairs of the dielectric layers, the core layer and the dielectric layers extending in respective planes of orthogonal first and second directions and stacked along a third direction that is orthogonal to the first and second directions; and
a magnetic core structure attached to a side of the multilevel lamination or metallization structure;
the conductive features including:
first and second patterned conductive features, the first patterned conductive feature having multiple turns to form a first winding, the second patterned conductive feature having multiple turns to form a second winding, the core layer positioned between the first and second patterned conductive features along the third direction,
first and second conductive capacitor plates, the core layer positioned between the first and second conductive capacitor plates along the third direction, and
first and second conductive field plates, the first conductive capacitor plate positioned between the first conductive field plate and the core layer along the third direction, and the second conductive capacitor plate positioned between the second conductive field plate and the core layer along the third direction.

12. The magnetic assembly of claim 11, wherein:
the first patterned conductive feature and the first conductive capacitor plate are formed in the same metal layer as each other; and
the second patterned conductive feature and the second conductive capacitor plate are formed in the same metal layer as each other.

13. The magnetic assembly of claim 12, wherein:
the first conductive field plate has a lateral extent in a first field plate plane of the first and second directions that extends beyond a lateral extent of the first conductive capacitor plate; and
the second conductive field plate has a lateral extent in a second field plate plane of the first and second directions that extends beyond a lateral extent of the second conductive capacitor plate.

14. The magnetic assembly of claim 11, further comprising a second magnetic core structure attached to a second side of the lamination or metallization structure.

15. The magnetic assembly of claim 11, wherein:
the first conductive field plate has a lateral extent in a first field plate plane of the first and second directions that extends beyond a lateral extent of the first conductive capacitor plate; and
the second conductive field plate has a lateral extent in a second field plate plane of the first and second directions that extends beyond a lateral extent of the second conductive capacitor plate.

16. The magnetic assembly of claim 15, further comprising:
a first conductive via coupled between the first conductive capacitor plate and the first conductive field plate; and
a second conductive via coupled between the second conductive capacitor plate and the second conductive field plate.

17. The magnetic assembly of claim 11, further comprising:
a first conductive via coupled between the first conductive capacitor plate and the first conductive field plate; and
a second conductive via coupled between the second conductive capacitor plate and the second conductive field plate.

18. A method for fabricating an electronic device, the method comprising:
fabricating a magnetic assembly including: first and second patterned conductive features having multiple turns to form respective first and second windings extending in respective planes of orthogonal first and second directions; first and second conductive capacitor plates spaced apart from opposite sides of a core layer along a third direction orthogonal to the first and second directions; and first and second conductive field plates, the first conductive capacitor plate positioned between the first conductive field plate and the core layer along the third direction, and the second conductive capacitor plate positioned between the second conductive field plate and the core layer along the third direction;

attaching the magnetic assembly to a support structure;

attaching a first semiconductor die to a first die attach pad;

attaching a second semiconductor die to a second die attach pad;

performing an electrical connection process that couples the first semiconductor die and the first winding in a first circuit, and couples the second semiconductor die and the second winding in a second circuit isolated from the first circuit; and performing a molding process that encloses the magnetic assembly, the first and second die attach pads and the first and second semiconductor dies in a package structure.

19. The method of claim 18, wherein fabricating the magnetic assembly further includes:

fabricating the first conductive field plate with a lateral extent in a first field plate plane of the first and second directions that extends beyond a lateral extent of the first conductive capacitor plate; and fabricating the second conductive field plate with a lateral extent in a second field plate plane of the first and second directions that extends beyond a lateral extent of the second conductive capacitor plate.

20. The method of claim 18, wherein fabricating the magnetic assembly further includes:

fabricating a first conductive via between the first conductive capacitor plate and the first conductive field plate; and fabricating a second conductive via between the second conductive capacitor plate and the second conductive field plate.

\* \* \* \* \*